(12) United States Patent
Mauer et al.

(10) Patent No.: US 10,541,180 B2
(45) Date of Patent: *Jan. 21, 2020

(54) APPARATUS AND METHOD FOR WAFER THINNING IN ADVANCED PACKAGING APPLICATIONS

(71) Applicant: VEECO PRECISION SURFACE PROCESSING LLC, Horsham, PA (US)

(72) Inventors: Laura Mauer, South Kent, CT (US); John Taddei, Jim Thorpe, PA (US); John Clark, Philadelphia, PA (US); Kenji Nulman, Warminster, PA (US)

(73) Assignee: VEECO PRECISION SURFACE PROCESSING LLC, Horsham, PA (US)

( * ) Notice: Subject to any disclaimer, the term of this patent is extended or adjusted under 35 U.S.C. 154(b) by 64 days.

This patent is subject to a terminal disclaimer.

(21) Appl. No.: 15/903,799

(22) Filed: Feb. 23, 2018

(65) Prior Publication Data
US 2018/0254221 A1     Sep. 6, 2018

Related U.S. Application Data

(60) Provisional application No. 62/466,451, filed on Mar. 3, 2017.

(51) Int. Cl.
*H01L 21/66* (2006.01)
*H01L 21/306* (2006.01)
*H01L 21/67* (2006.01)

(52) U.S. Cl.
CPC ........ *H01L 22/12* (2013.01); *H01L 21/30604* (2013.01); *H01L 21/6708* (2013.01); *H01L 21/67046* (2013.01); *H01L 21/67253* (2013.01); *H01L 22/20* (2013.01); *H01L 22/26* (2013.01)

(58) Field of Classification Search
CPC .................................................. H01L 21/30604
See application file for complete search history.

(56) References Cited

U.S. PATENT DOCUMENTS

| 6,123,865 | A  | 9/2000  | Lin et al. |
| 6,821,892 | B1 | 11/2004 | Peng et al. |
| 6,897,964 | B2 | 5/2005  | Takahashi et al. |

(Continued)

FOREIGN PATENT DOCUMENTS

WO     WO 2014/172835 A1     10/2014

OTHER PUBLICATIONS

Mauer et al., "Wet silicon etch process for TSV reveal", IEEE, Published in Electronic Components and Technology Conference (ECTC), 2014 IEEE 64th, May 27-30, 2014. pp. 1-5.

(Continued)

*Primary Examiner* — Mounir S Amer
(74) *Attorney, Agent, or Firm* — Leason Ellis LLP

(57) ABSTRACT

A system and method are provided for etching semiconductor wafers (integrated circuit substrates) with advanced packaging using a two-step wet etching process. The first etch step uses an etchant that is non-selective to at least the wafer material (silicon) and metals, such as copper and titanium, that are present in the wafer. The second etch step uses an etchant that is selective to the wafer material (silicon) and has low selectivity for the metals, thereby leaving them at least substantially intact.

31 Claims, 16 Drawing Sheets

(56) References Cited

U.S. PATENT DOCUMENTS

| | | |
|---|---|---|
| 7,175,505 B1 | 2/2007 | Ko et al. |
| 7,947,567 B2 | 5/2011 | Oh et al. |
| 8,617,348 B1 | 12/2013 | Liu et al. |
| 9,368,460 B2 | 6/2016 | Yu et al. |
| 9,541,837 B2 | 1/2017 | Taddei et al. |
| 9,698,062 B2 | 4/2017 | Mauer et al. |
| 2002/0074238 A1 | 6/2002 | Meyer et al. |
| 2003/0084918 A1 | 5/2003 | Kim |
| 2005/0048800 A1 | 3/2005 | Wagener |
| 2005/0245086 A1 | 11/2005 | Wang et al. |
| 2006/0003566 A1 | 1/2006 | Emesh |
| 2006/0097355 A1 | 5/2006 | Bauer et al. |
| 2006/0191637 A1 | 8/2006 | Zajac et al. |
| 2007/0169792 A1 | 7/2007 | Itzkowitz |
| 2008/0078427 A1 | 4/2008 | Matsunaga |
| 2008/0185103 A1 | 8/2008 | Bornstein et al. |
| 2008/0218983 A1 | 9/2008 | Nakamura |
| 2009/0278238 A1 | 11/2009 | Bonifield |
| 2010/0144118 A1 | 6/2010 | Yang |
| 2011/0222071 A1 | 9/2011 | Grotkopp |
| 2011/0261371 A1 | 10/2011 | Schoenleber |
| 2012/0053717 A1 | 3/2012 | Duboust |
| 2012/0119355 A1 | 5/2012 | Chung et al. |
| 2012/0182636 A1 | 7/2012 | Seibert et al. |
| 2012/0231562 A1 | 9/2012 | Takeya et al. |
| 2012/0285482 A1 | 11/2012 | Beck |
| 2012/0285483 A1 | 11/2012 | Liu et al. |
| 2013/0267099 A1 | 10/2013 | Yu |
| 2014/0038353 A1 | 2/2014 | Kim |
| 2014/0242731 A1 | 8/2014 | Mauer et al. |
| 2014/0327150 A1 | 11/2014 | Jung |
| 2015/0040952 A1 | 2/2015 | Regan et al. |
| 2015/0048496 A1 | 2/2015 | Chiu |
| 2015/0162289 A1 | 6/2015 | Chang et al. |
| 2016/0126148 A1 | 5/2016 | Mauer et al. |
| 2016/0126150 A1 | 5/2016 | Goldberg et al. |
| 2018/0294196 A1 | 10/2018 | Mauer et al. |

OTHER PUBLICATIONS

Mauer et al., "Lowering cost of silicon etch for revealing TSVs", Chip Scale Review, Nov./Dec. 2013. pp. 1-4.

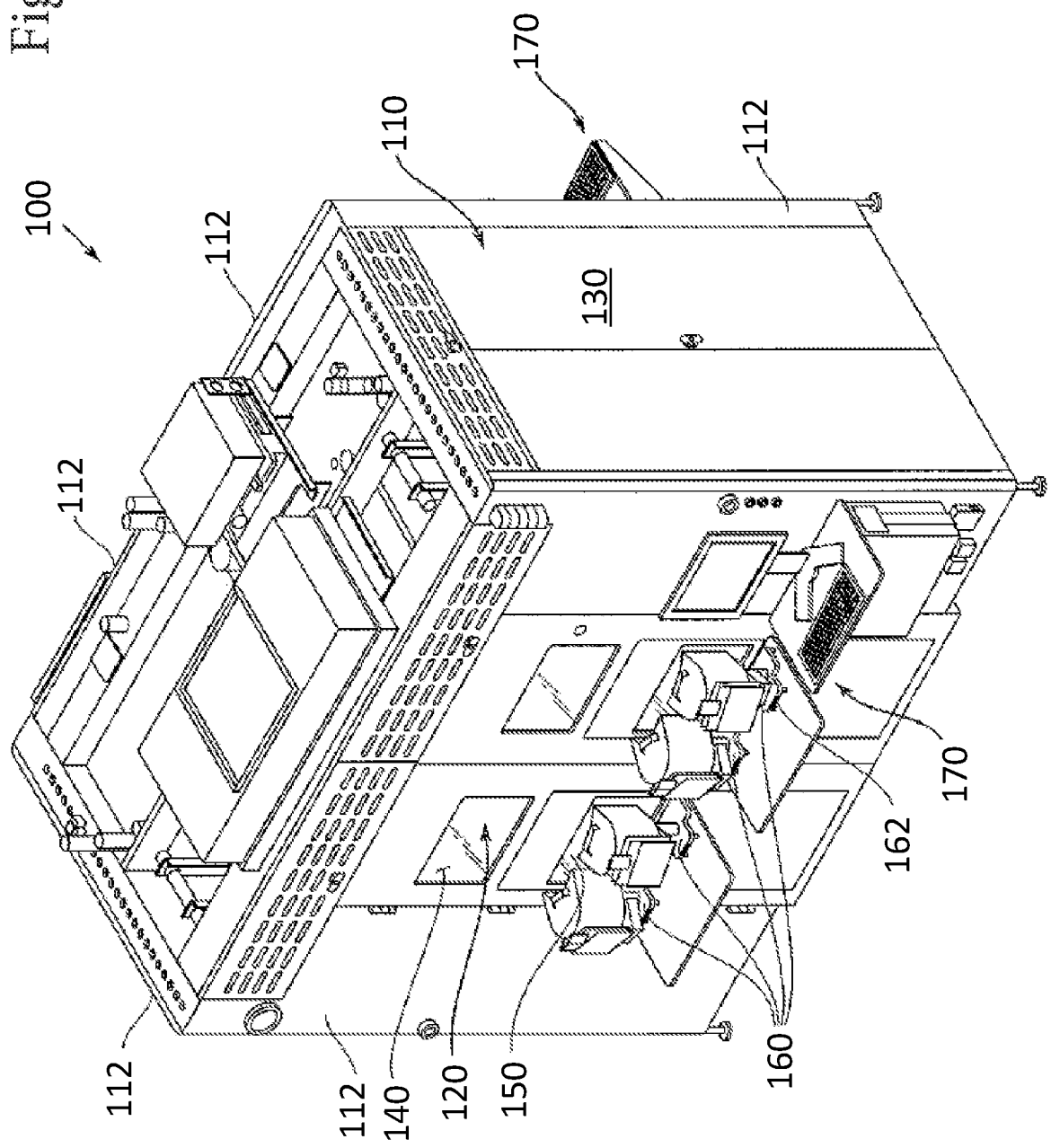

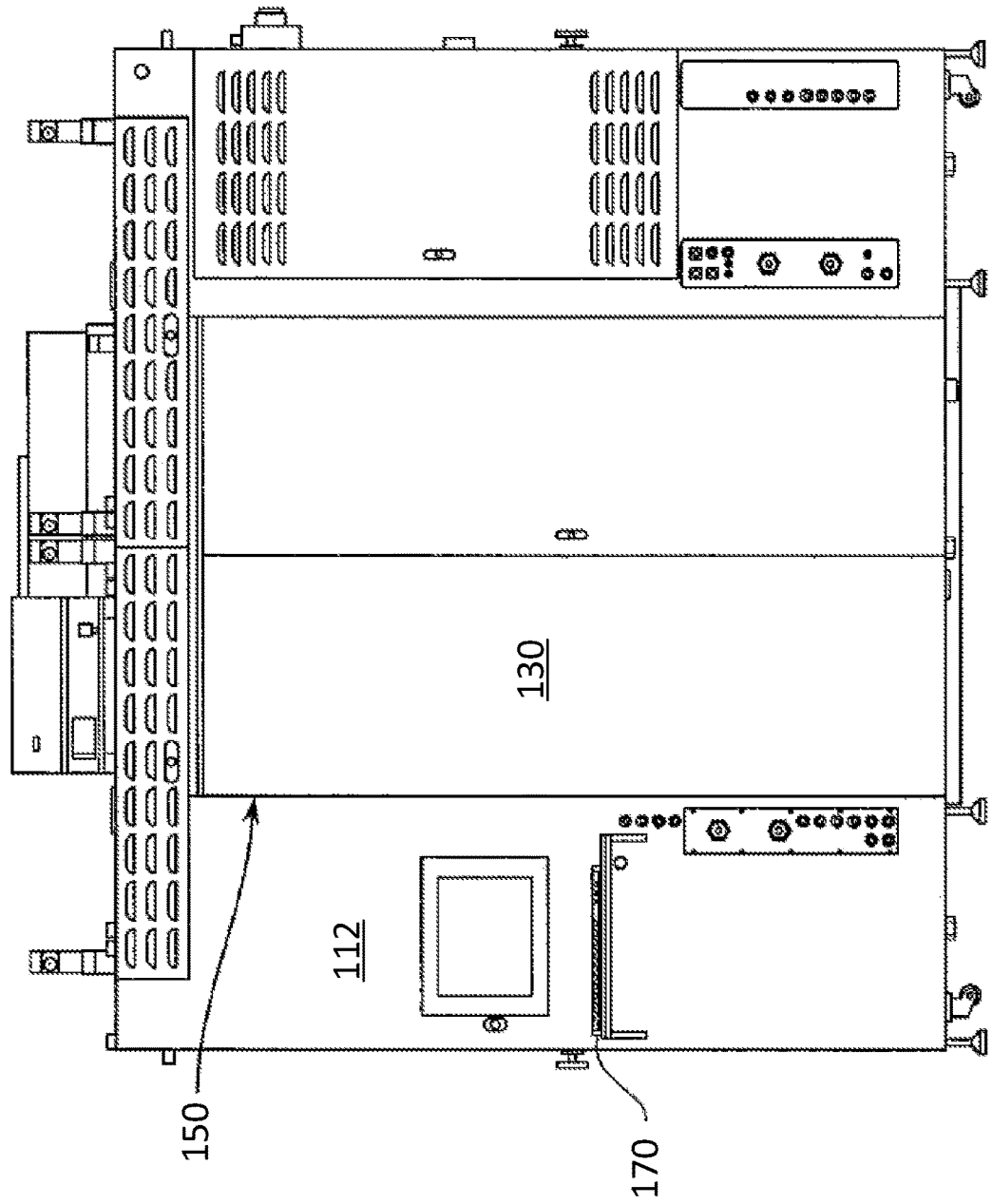

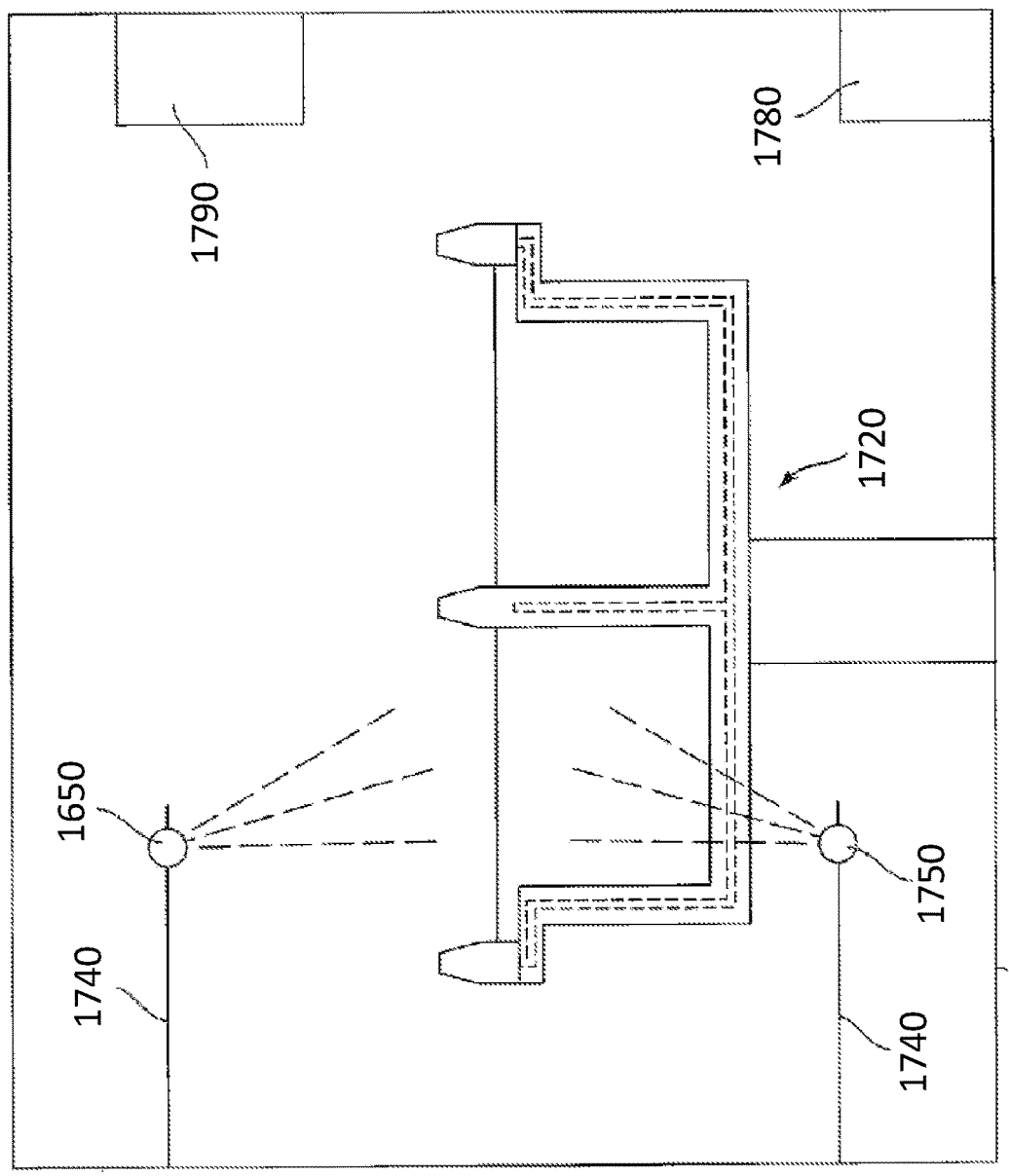

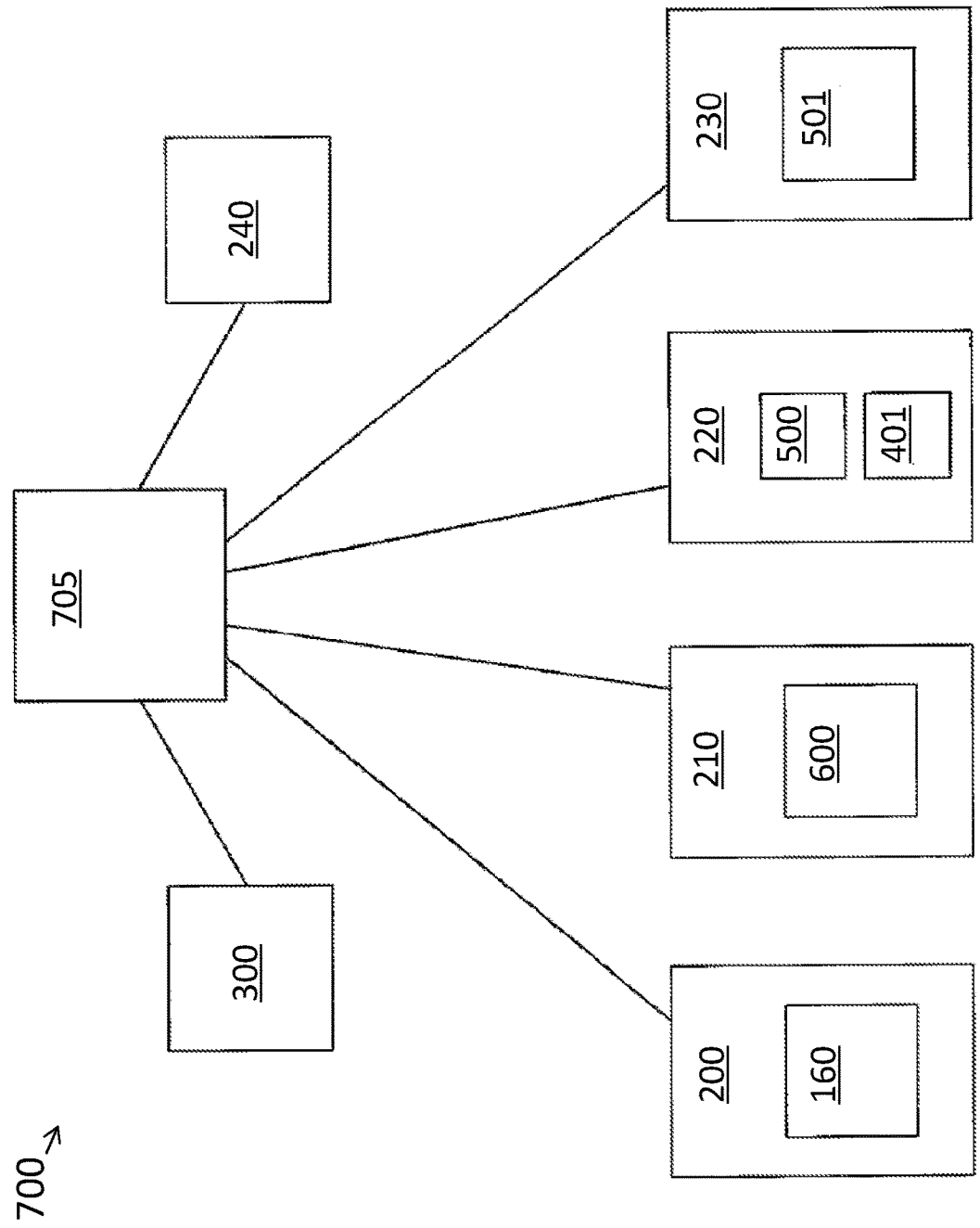

| HF/Nitric Mixture | | |
|---|---|---|
| Material | Etch Rate (nm/min) | Selectivity to Silicon |
| Si | 9000 | |
| SiO2 | 50 | 180 |
| Si3N4 | 2.7 | 3333 |
| Cu | 2400 | 3.8 |
| Ti | 750 | 12 |
| TiW | 144 | 63 |
| PI | 0 | >10000 |
| PBO | 0 | >10000 |

| SACHEM Reveal Etch™ | | |
|---|---|---|
| Material | Etch Rate (nm/min) | Selectivity to Silicon |
| Si | 711 | |
| SiO2 | 0.5 | 1422 |
| Si3N4 | 0 | >10000 |
| Cu | 12 | 59 |
| Ti | 0 | >10000 |
| TiW | 1.9 | 374 |
| PI | 5.6 | 95 |
| PBO | 7.5 | 126 |

Fig. 11A

| Material | Etch Rate, nm\min at 85C | Selectivity to Si |
|---|---|---|
| Si | 154 | x |
| Al | 3 | 51 |
| Ti, TiW | 0 | >5000 |
| SiO2 | 0.5 | >300 |
| Si3N4 | 0 | >5000 |

Fig. 11B

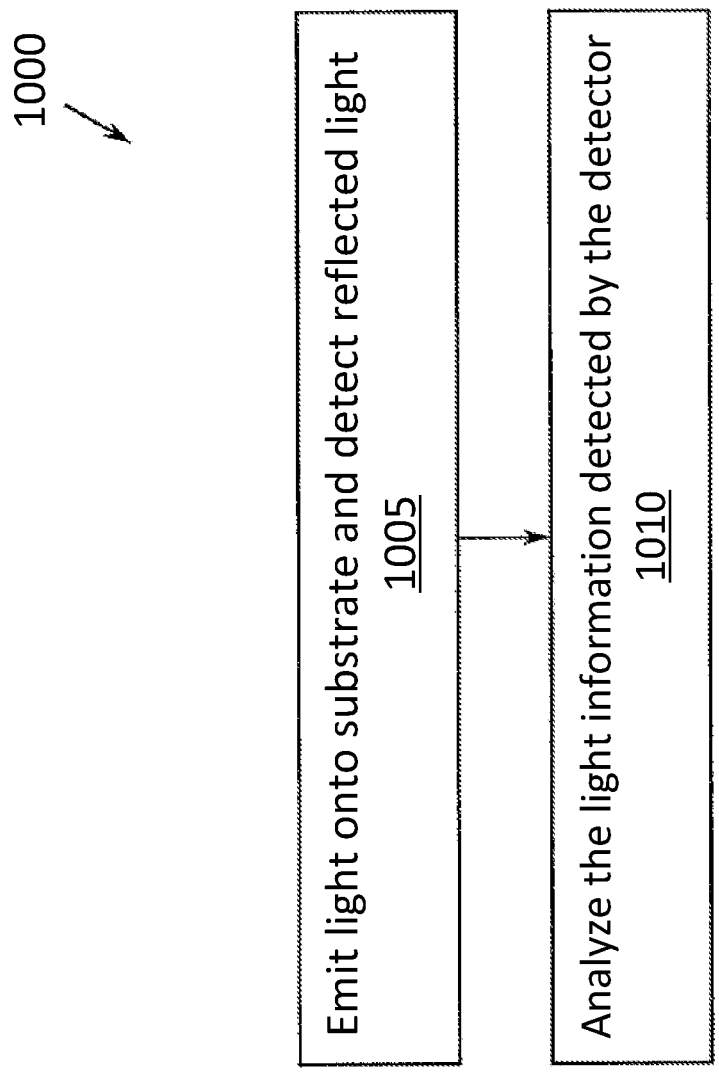

APPARATUS AND METHOD FOR WAFER THINNING IN ADVANCED PACKAGING APPLICATIONS

CROSS-REFERENCE TO RELATED APPLICATIONS

This application is based on and claims priority to U.S. Provisional Patent Application No. 62/466,451, filed Mar. 3, 2017, and is related to U.S. patent application Ser. No. 13/780,657, filed Feb. 28, 2013, now U.S. Pat. No. 9,698,062, issued Jul. 4, 2017, U.S. patent application Ser. No. 14/928,140, filed Oct. 30, 2015, and U.S. Provisional Patent Application No. 62/318,574, filed Apr. 5, 2016, each of which is hereby incorporated by reference in its respective entirety as if set forth herein.

TECHNICAL FIELD

The present invention generally relates to a system and method for etching semiconductor wafers for integrated circuits and, more specifically, relates to a system and method for etching semiconductor wafers (integrated circuit substrates) with advanced packaging using a two-step wet etching process.

BACKGROUND

Driven largely by the growing need for more data, increased functionality, and faster speeds, consumer electronic devices have sparked a revolution in integrated circuit (IC) design. As it becomes increasingly more expensive and technically challenging to scale down semiconductor devices, Moore's law is yielding to the concept of "More than Moore," which is driving integrated functionality in smaller and thinner packages. Packaging for 2.5D and 3D ICs has become critical to new products requiring higher performance and increased functionality in a smaller package. The use of a Through Silicon Via (TSV) has been discussed as a method for stacking die to achieve a vertical interconnect. However, the high costs associated with this technology have limited TSV use to a few applications such as high-bandwidth memory and logic, slowing its adoption within the industry to only those applications that obtain a premium price for the superior performance of TSV architecture. Those applications requiring enhanced performance but unable to support premium pricing in the marketplace require alternate solutions. As such, there is a need for alternatives to the TSV architecture.

IC wafers, which typically are in the form of flat round disks (although other shapes are possible) and often are made from silicon, gallium arsenide, or other materials, may be processed using various chemicals. To finish the manufacturing process of the IC wafers, the silicon (or other material) must be thinned without damaging the remaining elements of the IC wafer. Conventional processes for thinning wafers involves grinding to remove the bulk of the wafer and a multistep sequence of processes that includes chemical mechanical planarization (CMP) and plasma etching to complete the final thinning of the wafer. However, these conventional processes have a number of disadvantages associated therewith including but not limited to the complexity of the processes and the associated costs. As such, there is also a need for cost-effective alternative processes for thinning the IC wafers.

As described hereinafter, the present invention is directed at overcoming deficiencies associated with conventional IC designs and conventional wafer thinning processes.

SUMMARY OF THE INVENTION

According to a first aspect, a method for wet-etching a wafer having fan-out wafer level packaging (FOWLP) using a single wafer wet etching processing system is provided. The single wafer wet etching processing system includes a plurality of stations. The FOWLP wafer includes interconnect pads located within a redistribution layer (RDL) beneath a surface of the wafer. The method produces a processed wafer with each of the interconnect pads being revealed from the surface. In the method, an initial thickness of the wafer is measured at a measurement station. The surface of the wafer is then etched at a first etching station according to a first etch recipe and using a first etchant to thin the wafer material and leave a layer of residual wafer material having a prescribed residual substrate material thickness (RST) above the interconnect pads. The first etch recipe is based on the measured initial thickness. The surface of the wafer is then etched at a second etching station according to a second etch recipe using a second etchant to remove the remaining silicon and expose the interconnect pads. According to a further aspect, the first and second etchants comprise different chemical compositions.

According to another aspect, the method can include a process for determining the end point where the interconnect pads are revealed on the surface of the wafer is provided. In this aspect, light is emitted, with a light emitter, onto at least a portion of the surface of the wafer. The color of the light being reflected by the portion of the wafer is then detected with a light detector. Light information is generated based on the detected color of the reflected light. The light information is analyzed to compare a light signature of the wafer being etched to a reference light signature. An end point for when the interconnect pads are revealed by the etching at the second etch station is then determined based on the analysis of the light information.

These and other aspects, features, and advantages can be appreciated from the accompanying description of certain embodiments of the invention and the accompanying drawing figures and claims.

BRIEF DESCRIPTION OF THE DRAWINGS

FIG. 2 is a perspective view showing a system for performing a wet etching process in accordance with one or more embodiments disclosed herein;

FIG. 3 is a front plan view showing a system for performing a wet etching process in accordance with one embodiment disclosed herein;

FIG. 7B is a front plan view showing a cleaning station in accordance with one embodiment disclosed herein;

FIG. 8A is a block diagram showing an exemplary configuration of a system for performing a wet etching process in accordance with one or more embodiments disclosed herein;

FIG. 11A shows tables displaying the etch rate and selectivity for etching various compounds for exemplary non-selective and selective etchants in accordance with one or more embodiments disclosed herein;

FIG. 11B shows a table displaying the etch rate and selectivity for etching various compounds for another exemplary selective etchant in accordance with one or more embodiments disclosed herein;

FIG. 12 is a flow diagram illustrating a routine for performing a wet etching process in accordance with one or more embodiments disclosed herein.

DETAILED DESCRIPTION OF CERTAIN EMBODIMENTS OF THE INVENTION

By way of overview and introduction, various systems and methods are described herein that facilitate and enable the thinning of semiconductor wafers with advanced packaging, such as wafers with fan-out wafer level packaging (FOWLP). To meet the needs of higher density and performance with lower cost, the use of FOWLP in a variety of different integration schemes is being introduced into the market. This technology can provide an alternative to the traditional substrate and can be fabricated in a variety of different ways. For example, chip-first or chip-last FOWLP options provide processing schemes with both advantages and challenges. Similar to traditional substrates, however, the silicon of the FOWLP substrate must be thinned (etched) without affecting the other materials and structures of the substrate. Further, the substrate must be etched to a precise and uniform thickness regardless of the thickness of the silicon layer (overburden) prior to etching.

The present application provides systems and methods for wet-etching a FOWLP substrate. The present methods are a low-cost alternative to CMP and plasma etching processes. In one or more embodiments, the present application also includes an end-point detection device and process for determining the duration of etching for a substrate and determining when the etching of a particular substrate is complete, thereby allowing precise control over the etching process.

The referenced systems and methods are now described more fully with reference to the accompanying drawings, in which one or more illustrated embodiments and/or arrangements of the systems and methods are shown. The systems and methods are not limited in any way to the illustrated embodiments and/or arrangements as the illustrated embodiments described below are merely exemplary of the present systems and methods, as appreciated by one skilled in the art. Therefore, it is to be understood than any structural and functional details disclosed herein are not to be interpreted as limiting the systems and methods, but rather are provided as a representative embodiment and/or arrangement for teaching one skilled in the art one or more ways to implement the systems and methods. Accordingly, aspects of the present systems and methods can take the form of an entirely hardware embodiment, an entirely software embodiment, or an embodiment combining software and hardware. One of skill in the art can appreciate that a software process can be transformed into an equivalent hardware structure, and a hardware structure can itself be transformed into an equivalent software process. Thus, selection of a hardware implementation versus a software implementation is one of design choice.

FOWLP Substrate

Figure 1B:
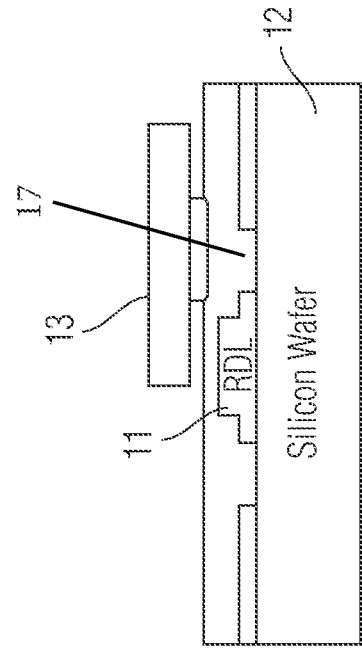
FIGS. 1A-1D are a set of figures that illustrate an exemplary process diagram for how an etched chip-last FOWLP substrate is produced in accordance with one or more embodiments disclosed herein.
Figure 1D:
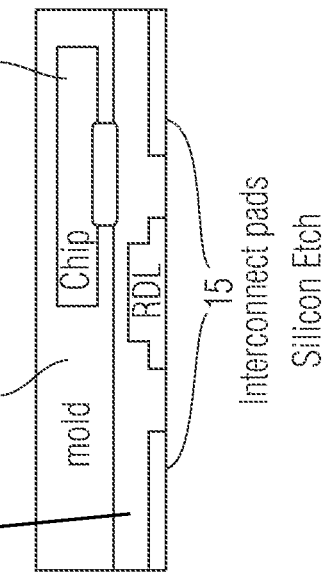
Figure 1A:
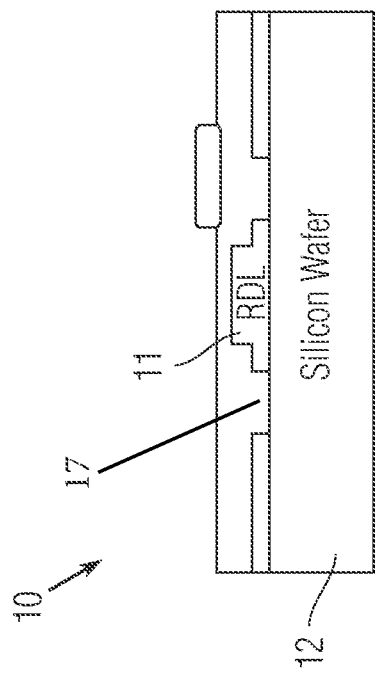
Figure 1C:
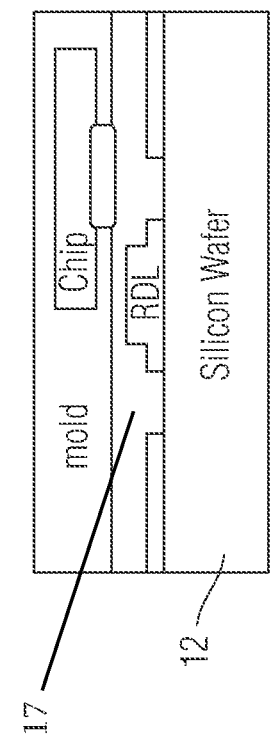

FIGS. 1A-1D show an exemplary process flow for producing an etched chip-last FOWLP substrate 10 in accordance with one or more implementations. As shown in the first diagram (top left), the substrate 10 begins with a redistribution layer (RDL) 11 on top of a silicon wafer carrier 12. As described herein the carrier 12 is generally made of silicon; however, in other implementations, the carrier 12 of the substrate 10 can be made of one or more other materials. The RDL 11 can comprise at least one interconnect pad 15 (e.g., an interconnect copper pad) located within the RDL 11. In FIGS. 1A-1D, there are two interconnect pads 15 identified with an isolation layer or material 17 being shown between the conductive material, such as interconnect pads 15, of the RDL 11. The isolation layer 17 is formed of a suitable non-conductive material for this particular application (e.g., silicon nitride). Next, a chip 13 can be added on top of the RDL 11 (FIG. 1B) in a face-down orientation. After the chip 13 has been added to the substrate 10, a mold compound 14 can be bonded onto the RDL 11 and chip 13 (e.g., using a bonding adhesive) to provide support for the RDL 11 and the chip (FIG. 1C). Finally, to complete the substrate 10, the silicon wafer 12 is thinned (etched) to remove the silicon 12, thereby revealing the RDL interconnect copper pads 15 (FIG. 1D). Upon removal of the wafer layer 12, mold compound 14 now acts as a support/backbone of the substrate 10. The process of etching the silicon 12 of the FOWLP substrate 10, in accordance with one or more embodiments of the present application, will be discussed in further detail below. While the following discussion of the present systems and methods references FOWLP substrates 10 having a chip-last orientation, it should be understood that the present systems and methods can also be applied other variations of FOWLP substrates including chip-first FOWLP substrates.

Wet Etch Systems and Methods

FIGS. 2-8 illustrate a system 100 for performing a wet etching process for FOWLP substrates in accordance with at least one embodiment of the present application. The system 100 can thus be thought of as being a wet-etching facility for manufacturing semiconductor devices. It will be appreciated that the teachings disclosed in the commonly owned U.S. patent applications that have been incorporated herein previously (U.S. patent application Ser. Nos. 13/780,657 and 14/928,140, and U.S. provisional patent application No. 62/318,574) can be implemented in the system 100.

In a wafer wet treatment process of a semiconductor device manufacturing process, there is generally an etching process and a cleaning process as mentioned hereinbefore. A single wafer wet treatment apparatus used in an etching process dispenses chemical etchant in a controlled manner on a substrate for inducing a chemical reaction during a fixed time. It will be understood that the terms "wafer" and "substrate" are used interchangeably herein. A single wafer wet treatment apparatus used in a cleaning process causes a chemical solution to be dispensed onto a substrate and can also include a scrubbing device to mechanically scrub the substrate. Each of the wet treatment apparatuses can include a bath that collects fluids that overflow and discharge to an outer tank (or bath) or recirculate. The single wafer wet treatment apparatuses are further composed of conduits (e.g., pipes) which supply or discharge fluids (e.g., chemicals, water, solutions and the like) in the bath, and various kinds of control means for controlling fluid temperature or concentration and other process parameters as further described herein. The wafer wet treatment process can also include a measuring step whereby the wafers are measured for thickness.

The system 100 of the present invention is for the most part a largely or fully integrated system, thereby greatly reducing or eliminating unnecessary wait or down times, etc. between processing steps.

The system 100 is an integrated system can be defined by a number of different devices (equipment pieces) that are located at different stations within a housing 110. As shown in FIG. 2, the housing 110 is generally in the form of an upstanding cabinet or the like that has a plurality of walls 112 that define a hollow interior 120. The hollow interior 120 can be accessible through a number of different access points, including but not limited to a door assembly 130 shown at one end of the housing 110 and one or more side walls 112 can include windows 140 to allow direct access and viewing of the hollow interior 120 and more particularly, the equipment and processing stations included therein. In one embodiment, as illustrated, one side wall 112 can include transparent windows 140 and one or more access points 150. The opposite side walls 112 can include an access point 150 of a different form, such as a set of doors as shown in FIG. 3.

Each access point 150 can be in the form of an opening that provides an entrance into the hollow interior 120 and in addition, a wafer holding and loading device (loadport) 160 can be provided at such location along one side wall 112. The device 160 can be any number of conventional devices that are designed to hold and permit access to wafers contained therein and can be in the form of a FOUP loadport, with FOUP being an acronym for Front Opening Unified Pod or Front Opening Universal Pod. A FOUP is a specialized plastic enclosure with a cassette therein designed to hold silicon wafers securely and safely in a controlled environment, and to allow the wafers to be removed for processing or measurement by tools equipped with appropriate loadports and robotic handling systems. As illustrated in FIG. 2, the device 160 can be in the form of an input/output cassette device.

The wafer holding and loading device (loadport) 160 can be in the form of an input/output wafer cassette device which includes a housing which is configured to receive and hold a cassette holding a plurality of wafers. For example, the housing can include a door 162 at each end thereof, with one door 162 facing outwardly away from the hollow interior 120 so as to allow a technician to load one or more wafers, into the loadport 160. Another door 162 faces and is accessible within the hollow interior 120 so as to permit automated removal (and reloading) of the wafer from within the hollow interior 120 to allow the wafer to be transferred to the various stations contained within the hollow interior 120. The wafer holding and loading device 160 can be of the type that includes a plurality of racks or the like for holding a plurality of wafers in a vertically stacked manner.

The housing (cabinet) 110 can also include one or more computer terminals 170 which operate in the manner described below and allow the technician to both control and monitor the processing of the wafer within the housing 110 as the wafer is subjected to the various processing steps at the different stations.

It will also be appreciated that the system 100 can include a number of different conventional operating systems to provide for power, cooling, heating, fluid flow (plumbing architecture), etc. The system 100 also includes a number of different safety features including an emergency off button and audible and/or visual alarms to alert the technician when an abnormal condition is observed within the system 100.

Figure 4:
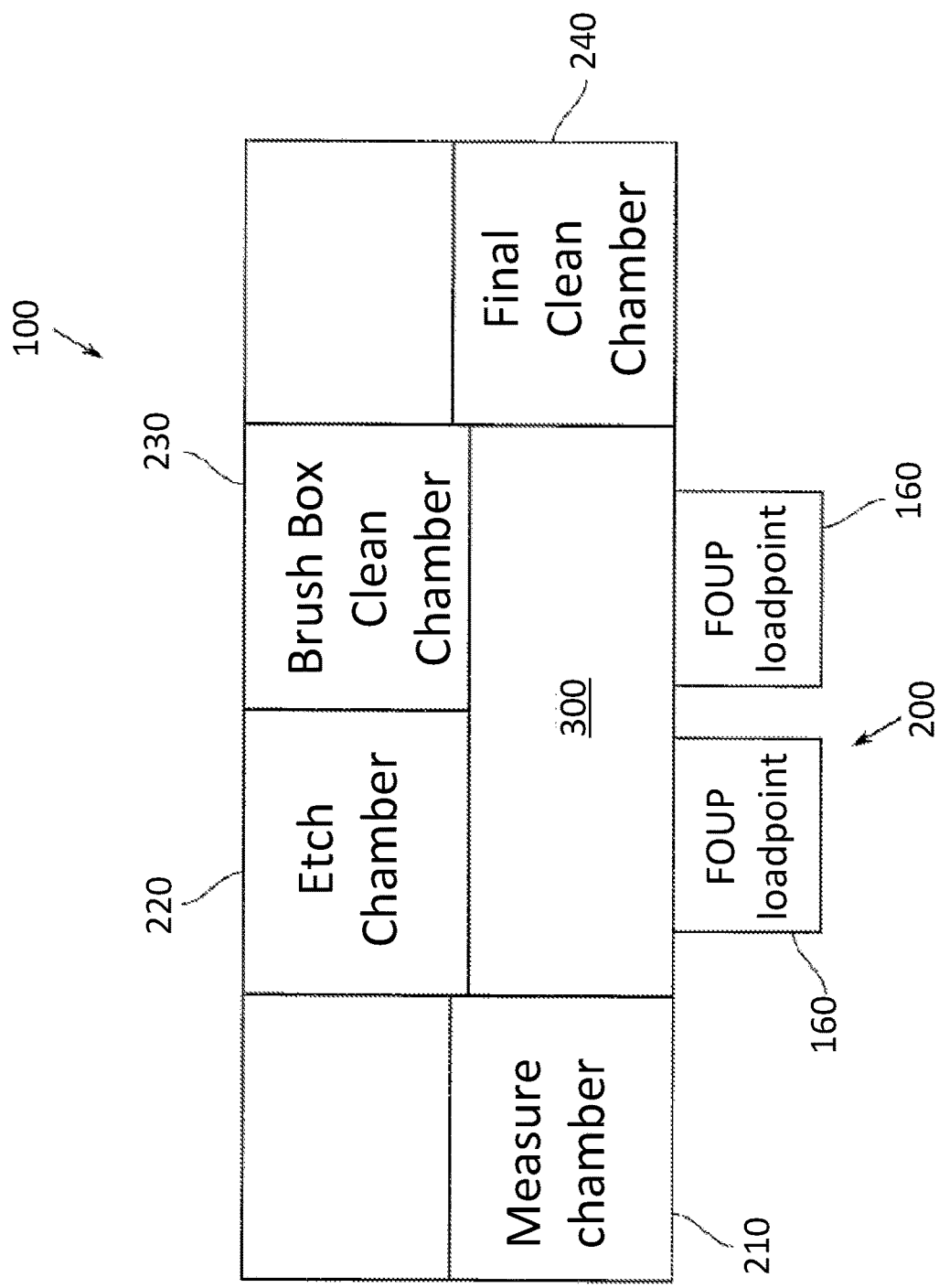
FIG. 4 is a block diagram showing an exemplary configuration of a system for performing a wet etching process in accordance with one or more embodiments disclosed herein.

FIG. 4 is a schematic view showing exemplary stations that are contained within the housing (cabinet) of the system of the present invention. In general, the system 100 includes a first station 200 that contains one or more devices 160 for holding wafers (e.g., FOUP loadports) and providing direct access to the interior 120 of the housing 110 as described above. A second station 210 is in the form of one or more measuring chambers for measuring different properties of the wafer as described below. A third station 220 contains one or more etch chambers for performing a single wafer wet-etching process on the wafer in accordance with the two-step etching process described herein. A fourth station 230 and optionally a fifth station 240 are cleaning chambers in which the processed wafer is cleaned. As a result of the system 100 being an automated system, a wafer transfer device 300 is provided and is configured to move one or more wafers from between the various stations of the system 100. The wafer transfer device 300 can take any number of different forms but generally is in the form of an automated device, such as a robot, that is configured to controllably grasp, move and release one or more wafers. Generally, the wafer transfer device 300 includes a robotic arm that has a grasp (holding) mechanism for grasping and holding a wafer and has a base about which the robotic arm can move in multiple directions (multiple degrees of freedom). It should be understood that one or more of the process stations/chambers can be combined to have multiple process functions. For example, the measuring apparatuses used in the measuring chamber can be incorporated into the wet etch chamber to provide a combined measuring and etch station. By way of further example, the etch chamber and cleaning chamber can be combined into multi-process chambers as would be understood by those skilled in the art.

Thus, the wafer transfer device 300 can thus be thought of as being an automated wafer handler. It will also be appreciated that the wafer transfer device is a computer operated device and therefore, as described below, operates in accordance with the execution of a software application, etc. In addition, it will also be appreciated that the wafer transfer device 300 can be operated in response to user generated commands, such as commands that are generated by the technician at a user interface, such as the computer terminal 170.

While in FIG. 4, the wafer transfer device 300 is shown as being centrally located within the interior of system 100, it is not limited to assuming such a position within the system so long as the wafer transfer device 300 is located at a position that allows the device 300 to access each of the stations of the system and transfer the wafer between all of the necessary stations.

Each of the individual stations mentioned above is described in greater detail below.

First Station 200

As mentioned above, the first station 200 includes one more wafer holding and loading devices (FOUP loadport or input/output cassettes) 160 for holding wafers in a sealed and secure manner. Any number of different conventional wafer holding and loading devices (FOUP loadport) 160 can be used in system 100. Typically, the wafer holding and loading device (FOUP loadport) 160 is of a type that contains a cassette holding the wafers. The door 162 is positioned such that the wafer transfer device (robot) 300 can directly access the wafers from the FOUP. The wafer holding and loading device (FOUP loadport) 160 can also include recognition features, such as RFID tag, barcode reader, etc. to allow it to be identified by readers on tools, etc. It should be understood that loadport 160 is not limited to being of an FOUP type. Various wafer holding and loading mechanisms can be used in addition to FOUPs having built in cassettes such as wafer boxes having removable cassettes as would be understood by those skilled in the art.

While FIG. 4 shows two blocks as constituting the station 200, it will be understood that this is only for illustrative purposes and is not limiting of the present invention since, as shown in FIG. 2, system 100 can include more than one wafer holding and loading device (FOUP loadport) 160. Moreover, it should be understood that each loadport 160 can be configured to receive one or more cassettes.

Second Station 210

As mentioned above, the second station 210 is a measuring station (wafer inspection station) in which a property of the wafer can be measured and in particular, the thickness of the wafer at one or more locations can be measured. The second station 210 thus includes a measuring device 600 for measuring one or more properties of a wafer. Any number of different types of measuring devices can be used. In accordance with one embodiment of the present invention, the measuring device 600 is in the form of an imaging device that is configured to measure one or more properties (e.g., wafer thickness and surface profile) of the wafer.

Figure 5:
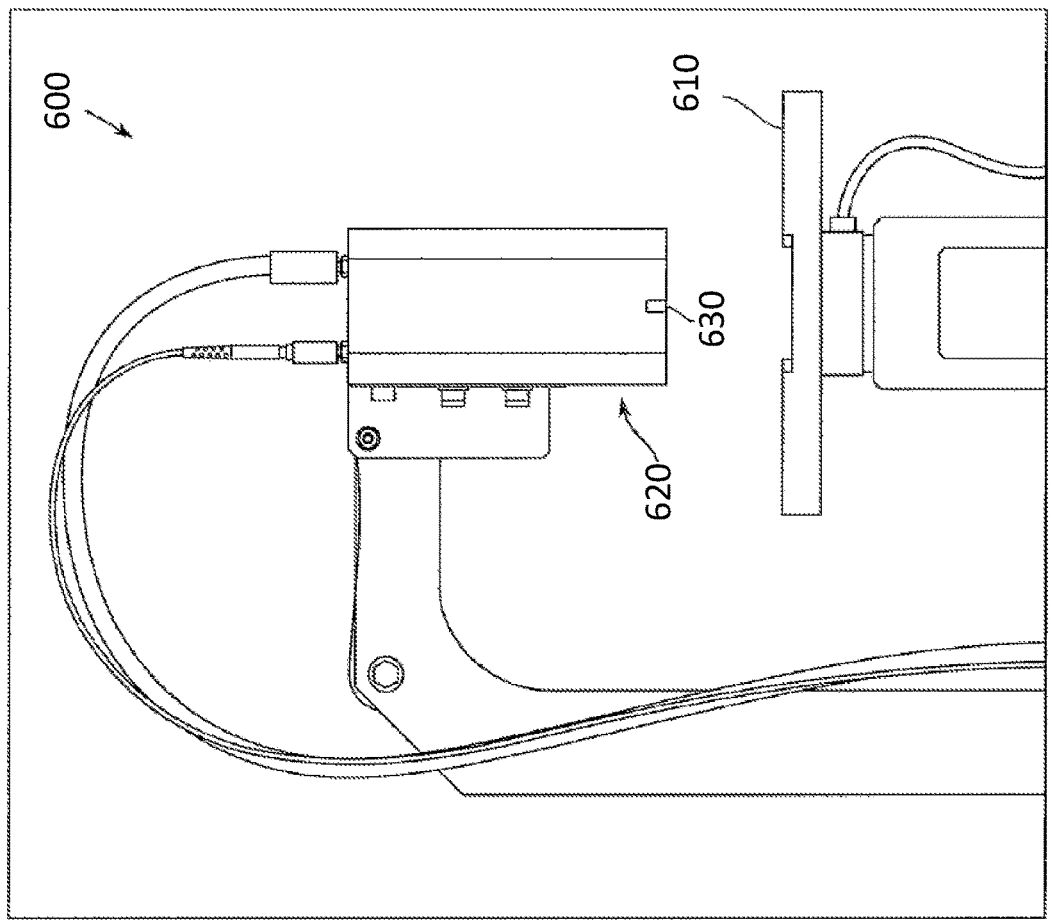
FIG. 5 is a front plan view showing a measurement station in accordance with one embodiment disclosed herein.

FIG. 5 shows one exemplary measuring (imaging) device 600 that includes a platform 610 for receiving and holding a wafer in a fixed orientation (e.g., in a horizontal orientation). The platform 610 can be of an adjustable type to accommodate different sized wafers. For example, the diameters of wafers can vary considerably and thus, the platform 610 is constructed to allow different sized wafers to be placed and supported thereon. In addition, the platform 160 can move in any number of different directions (x, y, z) (i.e., the platform 610 has multiple degrees of freedom of movement) and is rotatable such that the wafer can be rotated during the measuring process.

The imaging device 600 can also include a non-contact measurement component 620 that measures at least the thickness of the wafer and is also configured to detect (measure) and generate a surface profile for the wafer. The non-contact measurement component 620 includes imaging equipment and can be part of an automated device to allow movement of the component 620 with respect to the wafer on the platform 610. For example, the non-contact measurement component 620 can be in the form of an arm or the like that can move in any number of different directions (x, y, z) with respect to the wafer (i.e., the component 620 has multiple degrees of freedom of movement). Alternatively, or in addition, the component 620 can be held in a stationary position and platform 610 supporting the wafer can be moved in any number of different directions (x, y, z) with respect to the component 620 and/or rotated.

The non-contact measurement component 620 includes one or more sensors 630, such as an optical sensor (e.g., an IR light sensor) and a light source that is directed at the surface of the wafer. The reflected light (after contacting the wafer) is collected by the imaging device and based on the collected information (and after processing thereof in accordance with execution of software), a number of different measurements of the wafer can be taken and recorded. More particularly, light is reflected at the top and bottom of each surface in the film stack (the layers of material that form the wafer) and the distance in reflected light is corrected according to the refractive index of the material in order to calculate depth. For example, the imaging device can measure the following properties (which is not an exhaustive list): wafer thickness; bow, warp, flatness; surface roughness; total thickness variation (TTV); optical inspection pattern recognition; and interconnect pad depth, etc. One commercial source for one or more components of the imaging device is ISIS Sentronics gmbH, Germany however, other commercial sources are available.

In accordance with one aspect of the present invention and in direct contrast to conventional systems, the measuring station 210 is directly incorporated into and contained within the housing (cabinet) 110. As a result, the second station 210 and the imaging device 600 contained thereat is within reach of the wafer transfer device (robot) 300. This positioning allows the automated wafer transfer device 300 to easily move a wafer between the second station 210 and any of the other stations of the system 100. This is in direct contrast to conventional system in which measuring equipment is located at a remote location and requires wafers to be removed from the etch process in order for a measurement to be taken. After such measurement is taken, there is a wait period in which the wafer is held before being introduced back into the etch processing equipment. This leads to complexity and time delays, thereby directly and adversely impacting the number of wafers that can processed in a given time period. Moreover, in a production setting, these inefficiencies lead to batch processing of wafers, wherein multiple wafers are measured prior to being returned to the etch processing equipment. Accordingly, any feedback regarding the etching process is only obtainable on a batch to batch basis and not in real time (i.e., on a wafer to wafer basis) thereby preventing the adjustment of process parameters in real time (on a wafer to wafer basis) and resulting in a decrease in quality and an increase in waste. Incorporating the measuring device into system 100 and implementing a process that includes a measuring step for each wafer before and after etching in a single wafer wet etch chamber as further described herein provides a system capable of tailoring the etch process parameters to the specific characteristics of each wafer and feedback concerning previously etched wafers in real time. Accordingly, the system can achieve higher quality, minimize waste and the benefits generally associated with a single wafer wet etch process.

Third Station 220

The third station 220 is an etch station in which the wafer undergoes the single wafer wet etching process using the two-step process described herein. As mentioned before, a single wafer wet etching process is generally performed by dispensing a certain amount of chemical etchant onto a wafer disposed within the station and causing a chemical reaction with a contacted surface of the wafer so that the unnecessary portion of the contacted surface is etched by the chemical.

Figure 6:
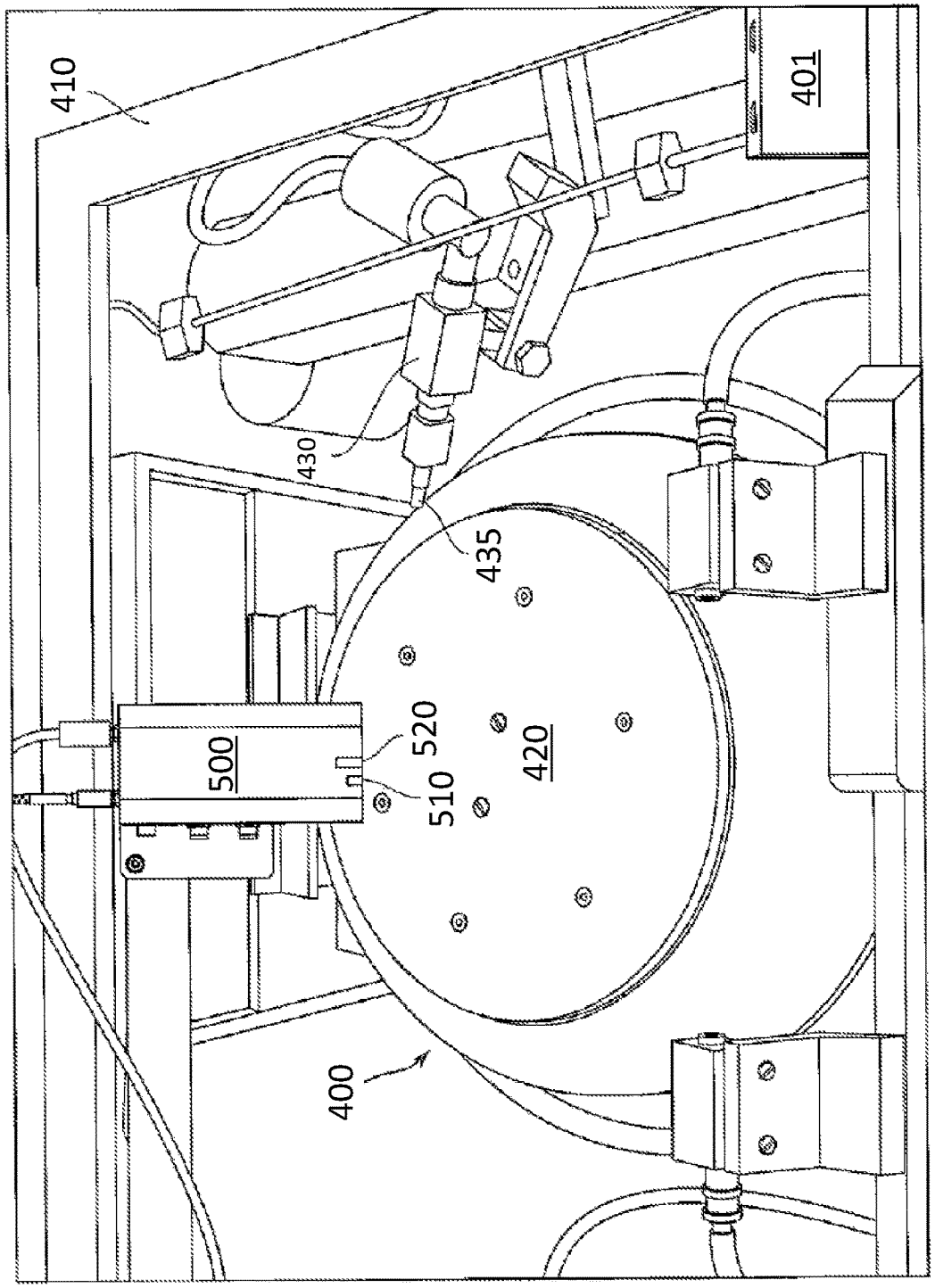
FIG. 6 is a perspective view showing a wet etching station in accordance with one or more embodiments disclosed herein.

As shown in FIG. 6, the third station (220) includes a single wafer wet etching apparatus 400 that includes an etch chamber (enclosure) 410 that contains the equipment and chemical etchant used in the wet etching process. The etch chamber 410 can thus be thought of as a chemical containment structure. It will be understood that third station can hold a plurality of etching apparatuses 410, such as is a vertically stacked orientation, to allow wet etching to be performed simultaneously on more than one wafer. The enclosure 410 also collects and contains the chemicals used in the etching process.

The wet etching apparatus 400 located at the third station 220 also includes spin chuck 420 (variable speed controlled by an etch controller 401 which is part of the overall process control system described herein) on which the wafer rests, as well as an etch tool (arm) 430 that includes one or more nozzles (orifice) 435 that dispenses a fluid (e.g., one or more liquids, preferably the chemical etchant). The etch tool 430 can be in the form of an arm that is movable along multiple directions (x, y, z directions) and thus, has multiple degrees of freedom. The etch tool 430 is a controllable tool in that it is controlled by a computing device such as etch controller 401 and is part of the overall programmable computer system employed in the system 100 as described herein. As a result, the etch tool 430 can be driven to any specific location of the wafer, etc.

The wet etching apparatus 400 also includes a fluid delivery and fluid removal system for both introducing the etch chemicals and removing such chemicals from the chamber. These components are implemented using a conventional fluid plumbing scheme in which conduits are provided for supplying fluid (e.g., one or more liquids, preferably a chemical etchant) to the nozzle 435. In addition, the wet etching apparatus 400 includes conduits and mechanisms for discharging fluid(s) that accumulate within the enclosure 410 during the wet etching process.

The mechanical chuck 420 permits the chuck 420 to hold the wafer. The chuck 420 includes a main shaft (not shown) which can be joined to a driving shaft of a motor so as to allow the wafer held by the spin chuck 420 to make a spin rotation about a Z-axis. A power source switch of the motor is connected to an output side of the etch controller 401, with the result that the rotation speed of the motor is controlled by the controller 401. Also, the spin chuck 420 can be supported by a lift mechanism (not shown) so as to be movable in a direction of the Z-axis.

Traditionally, around the outer periphery and bottom portion of the spin chuck 420 a structure is provided for receiving and collecting the etchant solution, which is centrifugally separated from the wafer and is then discharged to the outside. Part of the mechanism for discharging fluid(s) from the enclosure 410 can be an exhaust gas passageway and drain pipes that are formed in the bottom portions of the collector structure that surrounds the chuck 420. The liquid stored in the collector structure can be discharged to the outside through one or more drain pipes or re-circulated.

In accordance with the present invention, any number of suitable etching solutions can be used so long as they are suitable for a wet etching process and for the intended substrate and application. Thus, different chemistries can be used based on a number of different parameters, including in view of the properties of the wafer. As described herein, when a two-step etch process is undertaken, different etchants can be used as part of the different etch stages.

With respect to the delivery of the etchant solution, the wet etching apparatus 400 also includes means for controlling the flow properties (flow rate) and temperature of the etchant solution. The operating system can include one or more first flow rate control sections, including but not limited to a pump or valve, that extend from a liquid supply source to a nozzle. The operating section of the flow rate control section can be connected to the output side of the etch controller 401 so as to control the flow rate of the etchant solution supplied to the nozzle. In addition, other control mechanisms can be used to control the concentration of the etchant solution. The control of the concentration of the etchant is one means for controlling the overall etch rate and etch process for a given wafer.

In accordance with one aspect of the present invention, the wet etching apparatus 400 includes an end point detection device 500. One exemplary end point detection device 500 includes a light emitter 510 (e.g., a high intensity white light emitter) and a light detector 520 (e.g., charge-coupled device (CCD) detector). It will be appreciated that the light emitter 510 can have different constructions depending upon the particular applications in which it is used and in one embodiment, the light emitter is a high intensity white light emitter with a red filter. The operation of the end point detection device 500 is described in greater detail hereinafter; however, the device 500 is responsive to a computing device, such as etch controller 401 or computing device 170, and the light emitting device 510 emits light (e.g., white light) onto at least a portion of the surface of the particular wafer in the wet etching station 220. The light detector 520 (e.g., CCD detector) detects the light being reflected by the portion of the particular wafer and the CCD detector 520 transmits the detected light information to a process control system as further described herein. As described herein, the end point detection device 500 is advantageously employed by the present invention to expose RDL materials (e.g., interconnect pads) to a precise and uniform depth. It will be appreciated that the device 500 is not limited to being formed of the above pieces of equipment but in generally is an optics-based system in which light characteristics are analyzed in order to determine a property or condition of the substrate.

Fourth and Fifth Stations 230, 240

After the wafer undergoes processing at the etch station 220, the wafer is then cleaned at one or more wafer cleaning stations. FIG. 4 shows two distinct cleaning stations 230, 240; however, this is merely representative of one embodiment and it will be appreciated that a single cleaning station can be used. In such a construction, the single cleaning station can still employ one or more different cleaning techniques for cleaning the wafer.

Figure 7A:
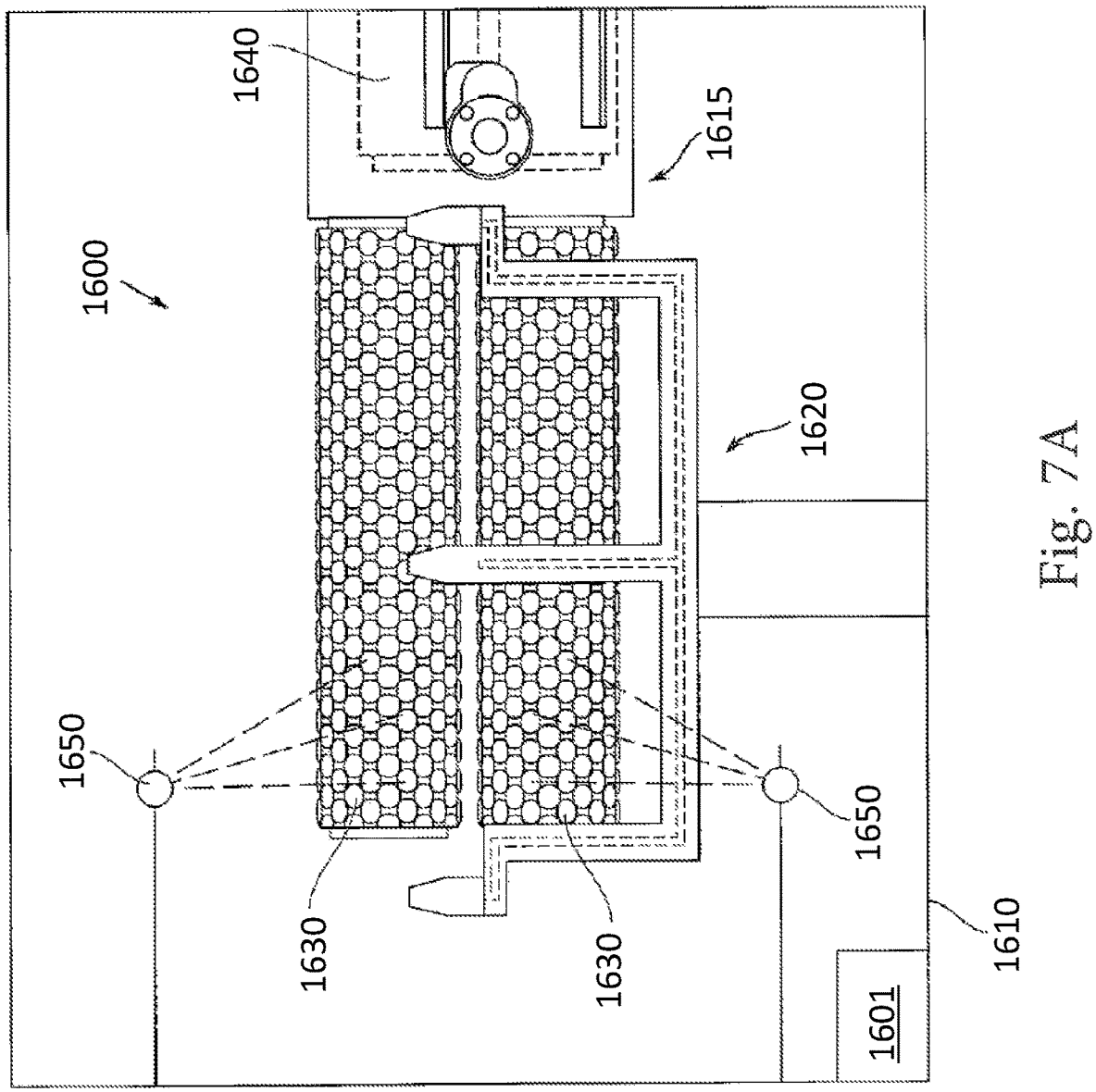
FIG. 7A is a front plan view showing a cleaning station in accordance with one embodiment disclosed herein.

As shown in FIG. 7A, the cleaning station 230 can be of a wafer cleaning apparatus 1600 (of the scrubbing or brush box type) in which the wafer is scrubbed while a cleaning solution is dispensed on the wafer to remove larger residual particles and etch residue. More specifically, the wafer cleaning apparatus 1600 can include a chamber (enclosure) 1610 that contains the equipment and contains the injected cleaning solution used in the cleaning process. The chamber thus at least partially is a sealed environment and can include a wafer scrubbing device 1615 which comprises a chuck 1620 (e.g., spin, rotating chuck) for supporting a wafer to be cleaned. The wafer scrubbing device also comprises a brush mechanism which includes one or more brushes 1630 for scrubbing the wafer. The brush mechanism also includes a drive mechanism 1640 for rotating the brushes, a clamping mechanism for clamping and unclamping the brushes, and a motor for driving the brushes, according to one or more controlled directions (e.g., radially) across the surfaces of the wafer.

During an exemplary scrubbing process, it is desirable to direct streams of water or streams of a cleaning solution at both surfaces of the spinning wafer to wash away particulates. This is typically accomplished by providing spray nozzles 1650 positioned above and/or below the wafer. The spray nozzles are preferably connected to a source of pure water or cleaning solution through supply pipes. The flow rate of the water or cleaning solution can be controlled by a pump and valve arrangement (not shown) which is, in turn, controlled by a cleaning controller 1601 (which is part of the overall process control system described herein). Alternatively, a pressurized fluid source can be used to provide fluid flow.

The cleaning station 240 can be a physically different station that is located proximate to the cleaning station 230 and is of a type in which the wafer is subjected to a different cleaning process than the one employed in the cleaning station 230. The cleaning station 240 can be thought of as being a final clean station. As mentioned above, the first cleaning step involves a scrubbing process which primarily removes the larger particles and residual etchant. The wafer can be transferred wet from the first cleaning station 230 to the final cleaning station 240.

As shown in FIG. 7B, similar to cleaning station 230, the final cleaning apparatus 1700 can be in the form of a chamber 1710 and includes one or more arms 1740 and nozzles 1750 to dispense a high velocity spray onto the wafer and/or use a megasonic cleaning apparatus 1780 for the removal of small particles from the wafer surface. In addition, station 240 can include a drying apparatus 1790 to dry the wafer at the end of the final cleaning process.

The Wet Etch Process Using System 100

FIG. 8A is a high-level diagram illustrating an exemplary configuration of a process control system 700 for use with the system 100 for performing a wet etching process. The present invention utilizes at least in some embodiments, a multi-step wet etch process as described herein. In one arrangement, the process control system consists of one or more computing devices including a process controller 705. It should be understood that process controller 705 can be practically any computing device and/or data processing apparatus capable of embodying the systems and/or methods described herein.

Process controller 705 can be configured to communicate with the various computer-controlled components of the system 100, including first station 200, second station 210, third station 220, fourth station 230, fifth station 240, and the computer controlled devices or controllers associated therewith including but not limited to wafer transfer device 300, FOUP loadports 160, imaging device 600, etch controller 401 and cleaning controller 501 transmitting electronic information to and receiving electronic information from the various components.

It should be noted that while FIG. 8A depicts the process control system 700 with respect to a process controller 705, it should be understood that any number of process controllers can interact with the process control system 700 and the constituent computer-controlled components of system 100 in the manner described herein. It should be further understood that while the various computing devices and machines referenced herein, including but not limited to computer terminal 170, process controller 705, first station 200, second station 210, third station 220, fourth station 230, fifth station 240, and the computer controlled devices or controllers associated therewith including but not limited to wafer transfer device 300, FOUP loadports 160, imaging device 600, etch controller 401 and cleaning controller 1601 are referred to herein as individual/single devices and/or machines, in certain implementations the referenced devices and machines, and their associated and/or accompanying operations, features, and/or functionalities can be arranged or otherwise employed across any number of devices and/or machines, such as over a direct connection or network connection, as is known to those of skill in the art.

Figure 8B:
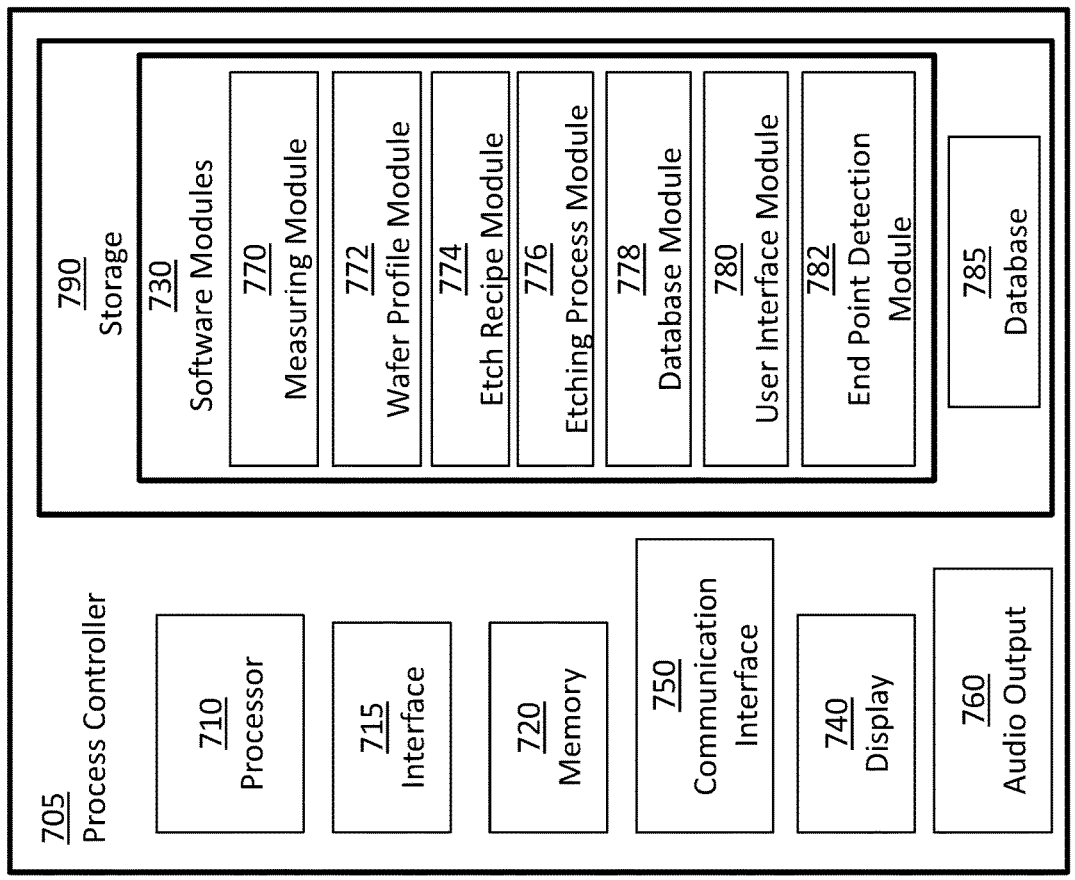
FIG. 8B is a block diagram showing an exemplary configuration of a process control system in accordance with one or more embodiments disclosed herein.

FIG. 8B is a block diagram illustrating an exemplary configuration of process controller 705 of the system 100 for performing a wet etching process. Process controller includes various hardware and software components that serve to enable operation of the system, including a processor 710, memory 720, display 740, storage 790 and a communication interface 750. Processor 710 serves to execute software instructions that can be loaded into memory 720. Processor 710 can be a number of processors, a multi-processor core, or some other type of processor, depending on the particular implementation.

Preferably, memory 720 and/or storage 790 are accessible by processor 710, thereby enabling processor to receive and execute instructions stored on memory and/or on storage. Memory can be, for example, a random access memory (RAM) or any other suitable volatile or non-volatile computer readable storage medium. In addition, memory can be fixed or removable. Storage 790 can take various forms, depending on the particular implementation. For example, storage can contain one or more components or devices such as a hard drive, a flash memory, a rewritable optical disk, a rewritable magnetic tape, or some combination of the above. Storage also can be fixed or removable.

One or more software modules 730 are encoded in storage 790 and/or in memory 720. The software modules can comprise one or more software programs or applications having computer program code or a set of instructions executed in processor 710. Such computer program code or instructions for carrying out operations for aspects of the systems and methods disclosed herein and can be written in any combination of one or more programming languages. The program code can execute entirely on process controller 705, as a stand-alone software package, partly on process controller, or entirely on another computing/device or partly on another remote computing/device. In the latter scenario, the remote computing device can be connected to process controller through any type of direct electronic connection or network, including a local area network (LAN) or a wide area network (WAN), or the connection can be made to an external computer (for example, through the Internet using an Internet Service Provider).

Preferably, included among the software modules 730 is a measuring module 770, a wafer profile module 772, an etch recipe module 774, an etching process module 776, a database module 778, a user interface module 780, and an end point detection module 782 that are executed by processor 710. During execution of the software modules 730, the processor configures the process controller 705 to perform various operations relating to the system 100 for performing a wet etching process, as will be described in greater detail below.

It can also be said that the program code of software modules 730 and one or more computer readable storage devices (such as memory 720 and/or storage 790) form a computer program product that can be manufactured and/or distributed in accordance with the present invention, as is known to those of ordinary skill in the art.

It should be understood that in some illustrative embodiments, one or more of software modules 730 can be downloaded over a network to storage 790 from another device or system via communication interface 750 for use within the system 100. In addition, it should be noted that other information and/or data relevant to the operation of the present systems and methods (such as database 785) can also be stored on storage, as will be discussed in greater detail below.

Also, preferably stored on storage 790 is database 785. As will be described in greater detail below, database contains and/or maintains various data items and elements that are utilized throughout the various operations of the system 100. The information stored in database can include but is not limited to, parameter adjustment algorithms, recipes, chemical mixture details, set-points, settings, alarms, actual values for process variables, and historical data collected and analyzed by the process controller (e.g., batch records, substrate thickness measurement information, RDL material depth measurement information) as will be described in greater detail herein. It should be noted that although database is depicted as being configured locally to process controller 705, in certain implementations database and/or various of the data elements stored therein can be located remotely (such as on a remote computing device or server—not shown) and connected to process controller through a network or in a manner known to those of ordinary skill in the art.

An interface 715 is also operatively connected to the processor 710. The interface can be one or more input device(s) such as switch(es), button(s), key(s), a touchscreen, microphone, etc. as would be understood in the art of electronic computing devices. Interface serves to facilitate the capture of commands from the user such as on-off commands or settings related to operation of the system 100.

Display 740 is also operatively connected to processor 710. Display includes a screen or any other such presentation device which enables the user to view information relating to operation of the system 100 including control settings, command prompts and data collected by various components of the system 100 and provided to process controller. By way of example, display can be a digital display such as a dot matrix display or other 2-dimensional display.

By way of further example, interface and display can be integrated into a touch screen display. Accordingly, the screen is used to show a graphical user interface, which can display various data and provide "forms" that include fields that allow for the entry of information by the user. Touching the touch screen at locations corresponding to the display of a graphical user interface allows the person to interact with the device to enter data, change settings, control functions, etc. So, when the touch screen is touched, interface communicates this change to processor, and settings can be changed or user entered information can be captured and stored in the memory.

Audio output 760 is also operatively connected to the processor 710. Audio output can be any type of speaker system that is configured to play electronic audio files or generate audio tones as would be understood by those of ordinary skill in the art. Audio output can be integrated to the process controller 705 or external to the process controller 705.

Communication interface 750 is also operatively connected to the processor 710 and can be any interface that enables communication between the process controller 705 and external devices, machines and/or elements including [robot, imaging device, etch controller, clean controller, chemistry controller]. Preferably, communication interface includes, but is not limited to, Ethernet, IEEE 1394, parallel, PS/2, Serial, USB, VGA, DVI, SCSI, HDMI, a Network Interface Card (NIC), an integrated network interface, a radio frequency transmitter/receiver (e.g., Bluetooth, cellular, NFC), a satellite communication transmitter/receiver, an infrared port, and/or any other such interfaces for connecting process controller 705 to other computing devices and/or communication networks such as private networks and the Internet. Such connections can include a wired connection (e.g. using the RS232 standard) or a wireless connection (e.g. using the 802.11 standard) though it should be understood that communication interface can be practically any interface that enables communication to/from the process controller 705.

At various points during the operation of the system 100 for performing a two-step wet etching process, process controller 705 can communicate with one or more computing devices, for instance, computing devices used to operate the various process stations and constituent devices as will be further described in greater detail herein. Such computing devices can transmit and/or receive data to/from process controller 705 and between one another, thereby preferably initiating maintaining, and/or enhancing the operation of the system 100, as will be described in greater detail below.

The operation of the system 100 for performing a two-step wet etching process and the various elements and components described above will be further appreciated with reference to the process for exposing RDL interconnect pads 15 on an FOWLP substrate as described below, in conjunction with FIGS. 9-13.

Two-Step Wet Etch Process

The two stage (two-step) etching process of the present application allows for varying degrees of etching precision. Further, using in-line measurement, adjustments to first and second etching recipes can be made to achieve optimized results and efficiency. For example, the first etch stage can be a preliminary etch or "fast etch" to efficiently reduce the thickness of the wafer layer 12 (overburden), minimize radial dependent non-uniformities in wafer thickness and, in some cases, expose the RDL copper pads 15. The second etching step can be a "selective etch" according to a more precise and more controlled etch recipe to achieve the final target wafer profile (the final wafer profile) in which the one or more RDL pads 15 are exposed, while the surrounding structure are left intact. In addition, if the FOWLP wafer does not meet the final wafer profile after the first and second etching step, the system can repeat the etching process until the respective target wafer profile is achieved.

In other words, the first etch stage can be used to effectively and with speed, etch the wafer overburden (silicon layer 12) and at a select point, the first stage is stopped and the second etch stage begins. The depth of the silicon overburden can vary between substrates. As such, integration of wafer thickness measurements before and after etching—within the single-wafer equipment—provides the high-accuracy process control needed for high-volume manufacturing. Improvement in surface roughness and etch uniformity are achieved with this two-step wet etch process through the combination of chemistry performance and process optimization.

The specific steps followed in process 900 will be described in further detail in conjunction with FIG. 9. It should be appreciated that more or fewer operations can be performed than shown in the figures and described herein. These operations can also be performed in a different order than those described herein, combined into multi step processes or broken into sub-routines. The steps are described in the context of system 100 however practice of the steps is not limited to the exemplary configuration of system 100 as described in FIGS. 2-8.

The execution of the silicon etch process of the present application includes several general stages. First, the silicon overburden (layer 12) depth and profile need to be determined. Second, the overburden needs to be etched with a fast sculpting etchant (first etch step) that is stopped at a point in which only a small and nearly uniform silicon overburden is left on the substrate. Third, the remaining overburden needs to be etched with a finishing etchant (the second etch step) that is selective to materials that will be exposed at the completion of the etch (e.g., RDL copper pads and other device), such that these materials are not damaged.

It should be noted that the bulk of the silicon overburden can be removed by grinding prior the present two-step process. As such, the remaining silicon may not be uniform in thickness and will therefore need to be etched in accordance with the following method, which compensates for these non-uniformities.

Figure 9:
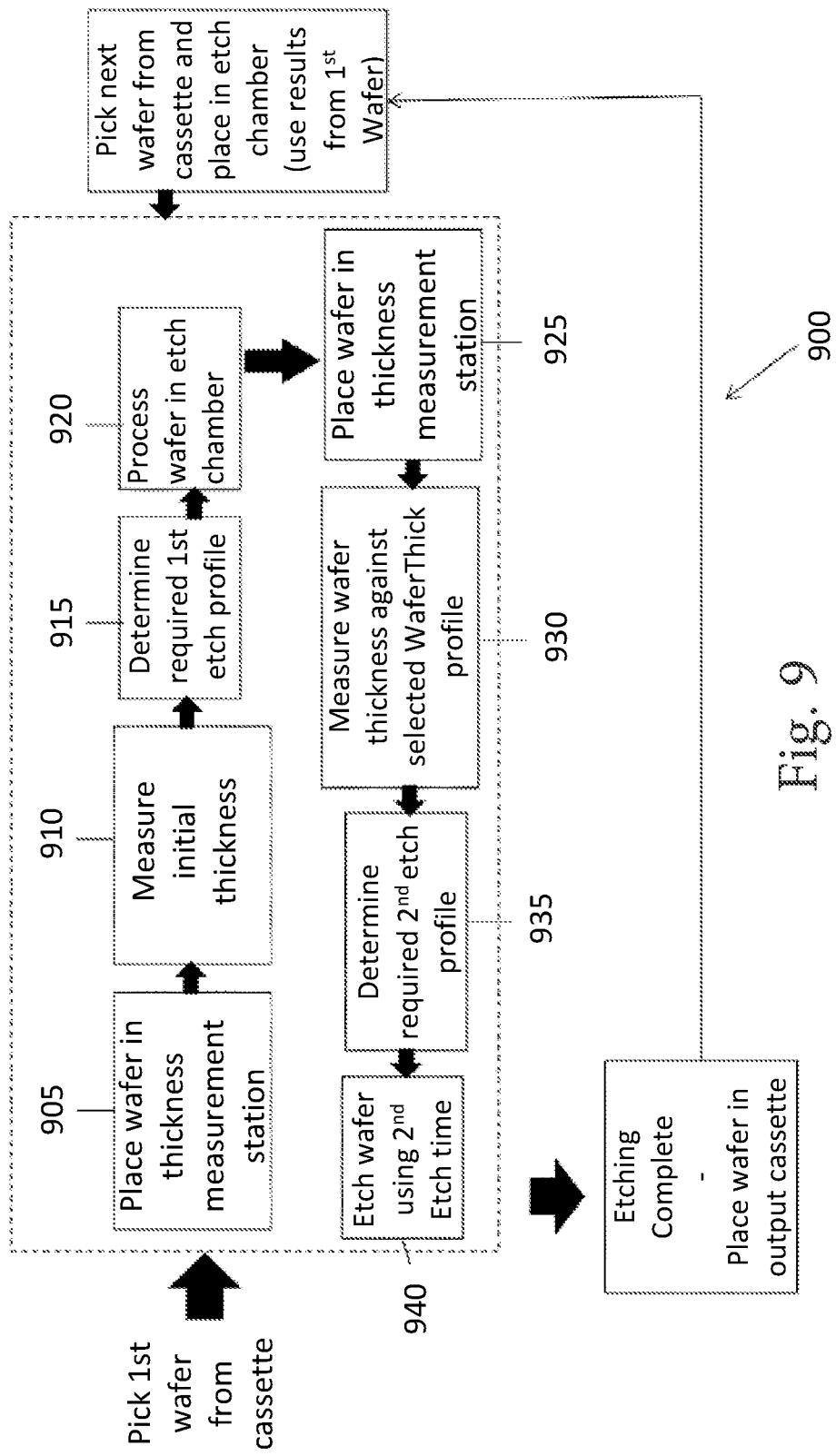
FIG. 9 is a flow diagram showing a routine for performing a wet etching process in accordance with one or more embodiments disclosed herein.

FIG. 9 is a flowchart illustrating a process flow 900 for etching wafers using system 100 in accordance with an embodiment of the invention. It should be understood that the exemplary process can be performed on post-grind FOWLP substrates 10 (i.e., wafers) in which the RDL pads 15 (e.g., copper pads) are not exposed along the top surface of the wafer 10 due to a layer of residual substrate material (e.g., silicon) also referred to as overburden. Moreover, the bottom surface of the wafer is mounted to a mold compound or carrier 14 (see FIG. 1), such as with a bonding adhesive, where the mold can vary in thickness from one wafer to another. However, it should be understood that FOWLP wafers are not limited to this particular carrier configuration as the exemplary process is operable on wafers in alternative carrier configurations and non-carrier configurations as would be understood by those skilled in the art. The exemplary process provides specialized metrology to determine the thickness of the overburden and wet etch FOWLP wafers in multiple stages using the system 100 to expose the RDL pads to a desired depth and wafer thickness uniformity. As described herein, the present system can employ two or more discrete wet etching stages (steps) that are performed in the same or different wet-etching stations in the system 100 for performing a wet etching process to expose the RDL pads to the desired depth.

As further described herein, the system 100 is configured to measure the wafer thickness, calculate a residual substrate material thickness RST at respective radial locations (as defined herein) (e.g., the thickness of the overburden above the top of the RDL 11) generate one or more etch recipes and, through multiple etching steps, selectively etch the wafer to minimize any radially dependent non-uniformities in RST and reveal the RDL pads 15. Two very different chemistries can be chosen for the specific attributes that each offers and the target of each etch step. In one exemplary implementation, the first etch step can be performed to eliminate the non-uniformities in RST thickness that result from the non-uniformity of the wafer thickness from the grinding step. The required etch time and etch profile will therefore be different for each wafer and be non-uniform in profile. This highly targeted non-uniform etch can be accomplished through the use of an isotropic etchant. In other words, the chemistry selected for the first etchant (e.g., HF:$HNO_3$ with viscosity agents, strong acid) is a non-selective silicon etchant that is very responsive to the location that it is dispensed onto by the nozzle with a high etch rate. In other words, dispensing etchant onto a particular radial location will concentrate (i.e., localize) the etching to the particular radial location that the stream of etchant is dispensed onto. Accordingly, this yields the ability to quickly and accurately sculpt the wafer to the target first wafer profile, in other words, thinning the non-uniform overburden layer and leaving a thin but uniform layer of substrate material remaining above the RDL pads 15. If no substrate layer remained above the RDL 11, this etchant could attack the RDL 11, the RDL interconnect pads 15, the bonding adhesive, or other aspects of the wafer and thereby ruin the wafer 10.

As discussed herein, a non-selective etch is one that is non-selective at least for silicon, copper, titanium, and isolating materials (layer 17), such as silicon nitride, that are included as part of one of the devices described herein. In other words, the non-selective etch will readily etch at least these materials. The first etchant is a non-selective etchant as described herein and is intended to quickly remove most of the silicon wafer material.

The second etch (i.e. "selective etch") in contrast is a methodic, anisotropic and repeatable process. This can be performed using a highly alkaline etchant, for example; however, as described herein, the selection of the etchant in part depends on a number of factors. The etchant is preferably selective to etch the silicon and not the RDL 11, RDL pads 15 or other materials of the wafer. The second etch removes the small amount of substrate material that remained covering the RDL pads 15 and materials and continues to etch so that the RDL pads become exposed. The second etch can have very little impact on the smoothness of the remaining silicon and no significant impact (or no impact) on the material in the RDL 11 (e.g., the liner or the conductive material [e.g., interconnect pads] in RDL). Since the first etch step corrected the non-uniformities in the wafer thickness, the second etch can be configured such that it is essentially uniform and repeatable across a batch of wafers and selective. The speed of the second etch step can be much less than the speed of the first etch step, such as on the order of up to 100 times slower than the first etch step.

In contrast, the first etchant is one which is intended to smooth the surface of the wafer. In many cases, there are application specific goals for surface texture. They are determined by the subsequent steps in the cycle. The composition of first etchant can thus be selected based on several factors including but not limited to, etch rate, incoming surface texture, desired post process surface texture. As described herein, in one embodiment, the first etchant can be a mixture containing HF:$HNO_3$ (the components involved in the chemical reaction and the primary etch rate components) and $H_3PO_4$ and $H_2SO_4$ (viscosity components that are not in the stoichiometry of the reaction but influence etch rate and surface texture).

The selective etch is thus one which removes silicon but does not significantly remove any of the other materials of the devices disclosed herein, such as copper, titanium, and the isolating materials. As a result and as described herein, this second etch is more of a fine tuning etch that is intended to remove only the remaining silicon while at least substantially leaving the other materials untouched (unetched).

Although process flow is generally discussed in relation to chip-last FOWLP wafers, it should be understood that the exemplary process can be performed on other FOWLP wafers and provides specialized metrology to determine the thickness of the wafer and other FOWLP wafers using system 100 to a desired final thickness and wafer thickness uniformity. As further described herein, process 900 can measure the thickness of a wafer before and after various stages in the wet etching process to dynamically adjust the etching of the wafer in subsequent etch steps to more precisely obtain the desired final wafer profile. In addition, the thickness measurements of previous wafers can be analyzed so as to dynamically adjust the processing parameters implemented for etching subsequent wafers in the batch accordingly. In addition or alternatively, the remaining wafers can undergo one or more of the measuring and etching steps described in routine 900 so as to process one or more of the wafers in view of their respective measurements indicating respective etching results.

With reference to FIG. 9, routine 900 begins at process block (step) 905, where the system 100 places the FOWLP wafer 10 into the wafer thickness measurement station 210. In process block 910, the system measures the initial thickness of a FOWLP wafer 10 and calculates the required etch depth for the wafer (the first etch profile) in accordance with the thickness measurements and wafer profile. As discussed herein, the profile of the wafer 10 is irregular due to preprocessing steps, such as grinding, etc., and therefore, the thickness of silicon material is not uniform across its diameter. The measurement step thus allows a thickness precise profile of the wafer to be generated. In one or more embodiments, the system 100 measures the thickness of the silicon using an integrated infrared (IR) sensor of the measurement station to determine the optimized etch profile. The wafer profile includes parameters that define a first set of target physical characteristics of the wafer after the first etching stage (first target wafer profile) and a final set of target physical characteristics after the secondary etching stage (final target wafer profile).

In process block 915, the system 100 analyzes the thickness measurements and generates a first etch recipe for the wafer to achieve the first target wafer profile for the wafer after the first etch step. In one or more implementations, the system 100 analyzes the thickness measurements and generates the first etch recipe dynamically and in real time for each wafer.

In process block 920, the system etches the wafer according to the first etch recipe. As discussed above, the first etch is a fast etch that utilizes a non-selective etchant such as a hydrofluoric acid:nitric acid (HF:HNO$_3$) mixture. The amount of silicon etched in the first etch stage depends the different aspects of the thickness measurements, which are analyzed by the system in determining the first etch recipe. For example, if the non-uniformity of the silicon overburden is radial in nature, the first etch stage can compensate for thickness variations and improve the differential. In contrast, if the non-uniformity is non-radial in nature, the first etch will leave more overburden for removal by the selective etch step relative to a substrate with radial non-uniformities.

It will be appreciated that in accordance with the present invention, one or more radial locations of the wafer is etched according to the calculated etch recipe. Each radial location is in the form of a continuous ring that surrounds a center point of the wafer. It will also be understood that when the radial location is etched, an at least substantially uniform etch is performed along the entire ring shape of the radial location. In other words, the etch depth is the same along the entire ring (i.e., a uniform etch is performed at each of the radial locations and it will further be understood that the etch depth can be different from one radial location to another].

Figure 10:
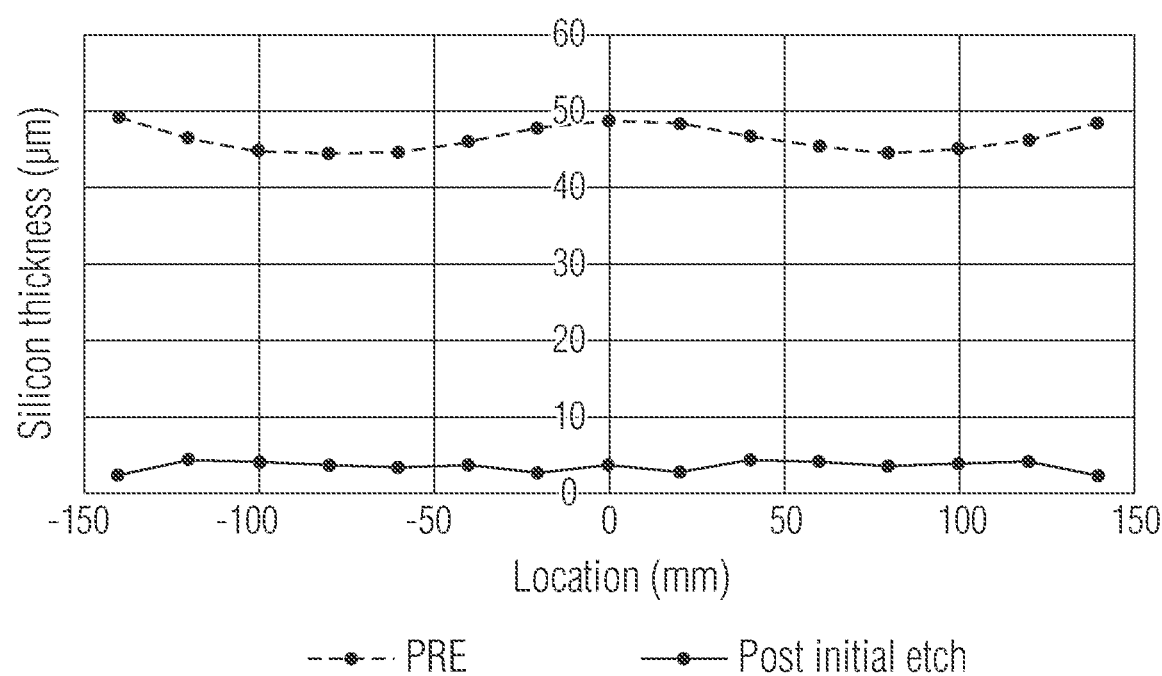
FIG. 10 shows an example of initial wafer thickness variations in an exemplary FOWLP substrate and the ability of the first etch to improve the uniformity of the silicon on the substrate in accordance with one or more embodiments disclosed herein.

As mentioned above, the first etch step removes the majority (e.g., a substantially amount in one embodiment) of the overburden remaining after the grinding step and eliminates the non-uniformities in silicon thickness. FIG. 10 shows an example of initial wafer thickness variations in a particular wafer and the ability of the first etch to improve the uniformity of the silicon on the wafer.

Referring back to FIG. 9, in process block 925, the system 100 can optionally place the wafer back into the wafer thickness measurement station. In process block 930, the system re-measures the thickness of the processed wafer. In addition, the measurement station provides the thickness measurements to the process controller to analyze the actual physical properties of the wafer and calculate the required etch depth for the wafer in accordance with the desired physical characteristics of the wafer after the second etching step ("selective etch step"). In process block 935, the system generates a second etch recipe for the wafer to achieve a second etch profile and, as a result, the final target wafer profile after the second etch step.

It will be understood that the step 930 can be eliminated in that after the first etch step is completed, the wafer can then immediately undergo the second etch step without having to remeasure the thickness of the wafer. Since the initial thickness profile of the wafer was known and the first etch step properties are known and the dispensing of the first etchant is controlled with precision, the amount of residual wafer material that should remain after completion of the first etch step can be calculated. The parameters concerning the second etch step (such as residence time of dispensing nozzle, etc.) can be calculated based on the predicted thickness of the residual wafer material that remains after the first etchant step and is to be removed in the second etch step by the second etchant. In this manner, the remeasurement step of block 930 can be eliminated.

In process block 940, the system etches the wafer according to the second etch recipe (second etch step). For this second etch, the etchant is changed to a finishing etchant (selective etchant) that is selective to materials that will be exposed at the completion of the etch (e.g., RDL interconnect pads 15), such that these materials are not damaged.

For example, in FOWLP substrate embodiments in which the RDL interconnect pads are made of copper, an etchant is used that has a chemical makeup that is selective to etching the overburden (e.g., silicon only) such that the copper pads will not be damaged. In particular, an exemplary selective etchant for an FOWLP substrate with copper interconnect pads is SACHEM TSV Reveal Etch™, which is a commercially available etchant that provides excellent selectively for etching silicon in the presence of other materials (e.g., copper). The tables at FIG. 11A show the etch rate and selectivity of an HF:Nitric acid mixture (i.e., an exemplary non-selective etchant) versus that of SACHEM TSV Reveal Etch™. As shown in FIG. 11A, SACHEM TSV Reveal Etch™ provides much greater selectivity (high selectivity) for silicon-based compounds (e.g., $SiO_2$, $Si_3N_4$) relative to a non-selective etchant (such as the one listed in the table). Further, SACHEM TSV Reveal Etch™ shows low selectivity to Copper (Cu), which helps to prevent damage to the copper interconnect pads during the etching process. This type of selective etchant also provides greater selectivity towards silicon relative to conventional plasma etching processes, which have approximately a 170:1 selectivity for silicon:$SiO_2$. Other examples of selective etchants that can be used in accordance with one or more embodiments include KOH and TMAH. However, it should be noted that SACHEM TSV Reveal Etch™ provides, in certain applications, an etch rate that is 2-4 times faster than KOH or TMAH etchants, and provides health and contamination benefits relative to KOH and TMAH. It will be understood that other suitable etchants can be used in accordance with the present invention so long as they perform the intended functions described herein.

For FOWLP substrate embodiments in which the interconnect pads 15 or other materials are made of other compounds, alternative chemistries must be used in the selective etchant to ensure that the etchant does not damages the interconnect pads 15 or other materials. For instance, in embodiments in which the interconnect pads 15 are made of aluminum, SACHEM Envure ST 2011™ can be used as the selective etchant, in accordance with one or more implementations. As shown in the table at FIG. 11B, SACHEM Envure ST 2011™ provides high selectivity for etching silicon-based compounds (e.g., $SiO_2$, $Si_3N_4$) and shows low selectivity for etching aluminum (Al), which helps to prevent damage to the aluminum interconnect pads during the etching process. Thus, in general, it should be understood that an ideal selective etchant is selective for etching the wafer material (e.g., silicon) and not the material forming the interconnect pads 15 (e.g., copper, aluminum) or other materials within the RDL 11. As a result, the second etch step is tailored to removing only the remaining residual amount of wafer material (e.g., silicon) that remains, while not etching the interconnect pads 15.

After the second etch step is complete, the wafer is removed from the etch station and placed on an output cassette. Once the etched wafer is removed from the etch station, a new wafer from the cassette device can be placed in the etch station. In some implementations, thickness measurements after the first and second etching steps for a particular wafer can be used to evaluate the efficacy of the respective etch recipes and adjust the etch recipe for subsequent wafers being put through process flow 900 accordingly. In some implementations, the post-etch thickness measurements can be used to re-calculate the preceding etch recipe and re-run the preceding etch step one or more times until the respective target wafer profile is achieved.

It should be understood that for each process step discussed in relation to FIG. 9, in one or more implementations the processor 710 executing one or more software modules 730 configures process controller 705 to initiate each step at the various stations, as discussed in further detail in U.S. patent application Ser. No. 14/928,140 incorporated herein previously. It should be further understood that in between each process step discussed in relation to FIG. 9, processor 710 executing one or more of software modules 730 configures process controller 705 to cause wafer transfer device 300 to move the particular wafer between the various stations performing the process steps.

It should also be noted that, in one or more alternative embodiments, a single etchant process can be used to remove the overburden and reveal the RDL materials. In at least one implementation, the single etchant process can be accomplished in accordance with the method described in U.S. patent application Ser. No. 13/780,657 incorporated herein previously. In at least one implementation of the single etchant process, an $HF:HNO_3$ mixture can be used as the single etchant for the complete etch. Further, an end point detection method (as described below) can also be utilized in conjunction with the single etchant process to ensure that the substrate is not exposed to the single etchant for too long of a period, which could result in damage to the substrate materials (e.g., interconnect pads).

In the present 2-step etch process, the etch time with the selective etchant (second etch) is generally kept to a minimum as the bonding adhesives used in the substrates oftentimes cannot withstand the chemicals used in the etchants for extended periods of time. This concern is further complicated by that fact that the selective etchants (second etchant) generally have a slower etch rate on silicone relative to the non-selective etchants (first etchant). Accordingly, the present process provides certain safeguards for keeping the second etch time as short as possible.

First, the control system of the present application analyzes the thickness measurements such that the generated etch recipe requires that as much of the silicon overburden as possible is removed by the non-selective etchant (first etch), while still leaving a safety margin of overburden. In other words, in the generated etch recipe for the first etch takes into account how much etch time is required to leave a safety margin of silicon overburden, which will subsequently be removed by the second selective etch. In one or more implementations, a safety margin of 1-2 microns of silicon is typical (in one embodiment, the safety margin is at least about 1 micron). The safety margin of silicon overburden is ideally thin and uniform, such that the selective etch (second etch) time is shortened. Second, the control system determines the end-point of the etching process (i.e., point at which the RDL interconnect pads are sufficiently revealed) by monitoring the color changes (received detector data) in the substrate during the etching process. In particular, a reference substrate can be used to determine the approximate time end-point of the etching process, such that the etch recipe for subsequent substrates can be adjusted accordingly. More specifically, based on the changes of color (light intensity data) gathered during the etching of the reference substrate, as well as the etch rate and initial and final thickness information for the reference substrate, the control system can adjust the etch recipe (as described in relation to process flow 900) for the subsequent substrate, as discussed in further detail below.

End-Point Detection Method

Turning now to FIG. 12, a flow diagram illustrates a routine 1000 for detecting the point in which the RDL interconnect pad is revealed in the wafer during the wet etching process step 940 (e.g., two-step etch) in accordance with at least one embodiment disclosed herein. It should be appreciated that more or fewer operations can be performed than shown in the figures and described herein. These operations can also be performed in a different order than those described herein.

The process begins at step 1005, where processor 710 executing one or more of software modules 730, including, preferably end point detection module 782, configures process controller 705 to cause light emitter 510 to emit light onto at least a portion of the surface of the particular substrate (sample area) and cause the light detector 520 to detect the color of the light being reflected by the portion of the particular substrate. Preferably, the light detector is a CCD detector, although other alternative light detectors can be used. Light information is generated based on the light reflected by the substrate. The detector transmits the detected reflected light information to the process controller as further described herein. When etching substrates to reveal the one or more RDL interconnect pads, more light is reflected by the interconnect pads at the end of the process under ambient light relative to the light reflected by the silicone. According to salient aspects of the disclosed embodiments, high intensity LED and\or colored high intensity light can be directed at the substrate to enhance the light signature reflected by the substrate. The light signature includes the intensity of one or more particular wavelengths of light that are detected and monitored by the process controller. For example, in detecting the reveal point of the RDL interconnect pads in a silicon wafer, the light signature can include three wavelengths of light (blue, red and green). The emitter and/or detector can include one or more light filters such as a red light filter to adjust the characteristics of the light emitted and/or detected. The sample area of the particular substrate that is being monitored by the end point detection device can be one or more points on the surface and can be defined by the process controller by default or by the user. The plurality of points can each correspond to one or more pixels of the CCD detector and the detected reflected light can be averaged to reduce variations due to noise and distortion from the fluid layer on the substrate. The averaged intensity information can be recorded by the process controller and can also be plotted on a chart and displayed on display.

Then at step 1010, processor 710 executing one or more of software modules 730, including, preferably end point detection module 782, configures process controller 705 to analyze the light information detected by the CCD detector to compare the light signature of the particular substrate being etched, as detected by the CCD, to a reference light signature.

It should be understood that at some point prior to etching the particular substrate and/or subsequent substrates, processor executing one or more software modules including, preferably end point detection module, can configure the process controller to determine a reference light intensity by etching a reference substrate for a set duration and analyzing frames of information collected by the CCD at specified intervals during the etching process and calculate the intensity of three wavelengths of light (blue, red and green) at each frame and noting the intensity of the three wavelengths of light when the RDL interconnect pads are known to be revealed. The process controller can also plot the light intensity data for the reference substrate over time and display the plot to a technician. The change in the light signature should be similar for subsequent substrates that are run, provided that subsequent substrates have similar physical properties (e.g., substrate composition and size and interconnect pad composition and size), as would be understood by those skilled in the art. It should also be understood that the particular rate of change of the light signature can vary depending on the particular etch recipe.

In regards to determining the end point while etching the particular substrate and subsequent substrates, the process controller can detect when the reveal point is reached by analyzing frames of reflected light intensity information collected by the CCD at specified intervals during the etching process and calculate the intensity of three wavelengths of light (blue, red and green) at each frame and compare the light intensity information to the reference light intensity information obtained from the reference substrate. When the light intensity information of the particular substrate corresponds to the reference light intensity information the process controller can end the etching process or begin the over etch stage.

Based on light intensity data, etch rate and initial and final thickness information for the reference substrate, the system can adjust the etch recipe (as described in relation to process flow 900) for the subsequent substrate and other parameters including but not limited to setting a minimum duration, a maximum duration, the light intensity at the point where RDL interconnect pads are revealed, and end point of the etch process. The end point can be defined as an over etch duration (e.g., how long the etch process should continue after reveal point is detected), in terms of seconds or percentage of process time in order to reveal the RDL interconnect pads.

For example, when a reference substrate is run, a 2 µm overburden is removed and the light intensity brightens when the RDL interconnect pads are first revealed at 60 seconds after the etch (second etch) started (i.e., it takes 60 secs to remove 2 µm of overburden). From this point the etch needs to continue for another 60 seconds (i.e., "over etch") to be sure all silicon overburden is removed. Assuming the average etch depth for a subsequent substrate is say, 10 µm (this simplified example is discussed in terms of average etch depth since there may exist radial thickness variations as described above), the system shows the endpoint signal change at 5 minutes and after that point etch only for an additional 60 seconds. The system can determine this by seeing the brighter intensity signal when the 10 µm is removed. Again, in this example, there needs to be a 60-second over etch to clear all residual silicon overburden. In other words, because the reference substrate (2 µm silicon film) needed 120 seconds of etching (60 seconds for first reveal plus 60 seconds of over etch), the subsequent substrate (10 µm film) requires 360 seconds of etching (300 seconds for first reveal plus 60 seconds of over etch).

Figure 13:
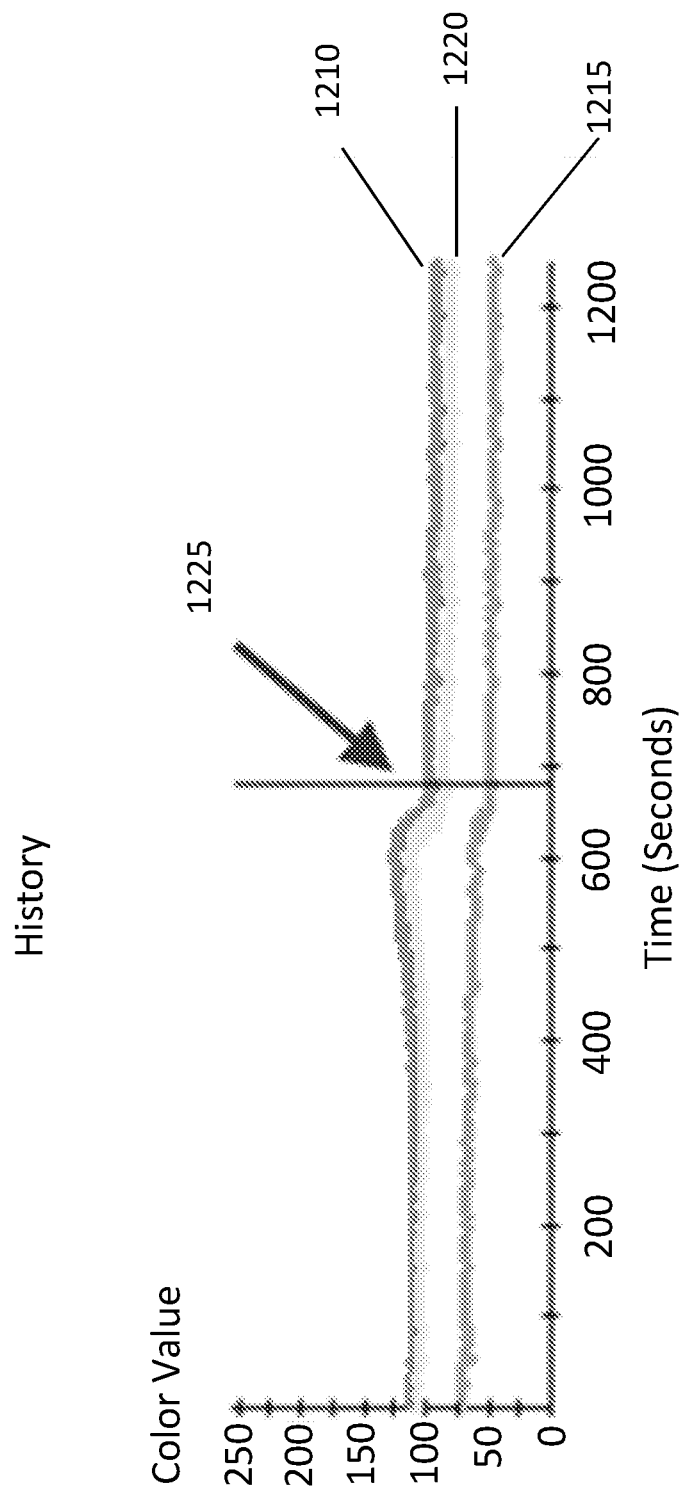
FIG. 13 is a graph showing light intensity values over time in accordance with one or more embodiments disclosed herein.

FIG. 13 depicts an exemplary graph of the light intensity data for the duration of an RDL interconnect pad reveal process (end point detection process) according to a disclosed embodiment. The graph depicts light intensity data for the red 1210, blue 1215 and green 1220 wavelengths of light for a reference substrate previously etched. The intensity data is plotted for the duration of the etching process. In this example, the graph depicts the light intensity at the end point 1225 of the reference wafer at around t=680. This end point includes the time to expose the interconnect pad.

Accordingly, system 100, which includes the single wafer wet etching apparatus 400 that includes an end point detection device 500 and implements the routine 1000 for detecting the point in which RDL interconnect pads are revealed provides an automated solution to precisely control the interconnect pad reveal point and adjust etch recipe parameters in real time according to feedback concerning previously etched wafers. Accordingly, the system results in higher quality processed FOWLP substrates, minimizes waste and realizes the benefits generally associated with a single wafer wet etch process. Although the wet etching step incorporating end point detection has been described in relation to process flow 900, it should be understood that single wafer wet etching with end point detection can be performed in the absence of one or more of the other steps of process flow 900.

Preferably, throughout the execution of process flow 900 and/or routine 1000, various information and data is collected by the components of system 100, including but not limited to process controller 705, first station 200, second station 210, third station 220, fourth station 230, fifth station 240, and the computer controlled devices or controllers associated therewith including but not limited to wafer transfer device 300, FOUP loadports 160, imaging device 600, etch controller 401, end point detection device 500 and cleaning controller 1601. Processor 710, executing one or more software modules 730, including, database module 780 and display module 780, can configure process controller 705 to collect at least a portion of the data from the various components of system 100, store the collected data in storage 790 and/or memory 720. Furthermore, process controller can display the data on display 740, either in raw form, or manipulated form such as a graphical representation as would be understood by those skilled in the art.

At this juncture, it should be noted that although much of the foregoing description has been directed to a system for performing a wet etching process and methods for wet etching FOWLP substrates to reveal RDL interconnect pads, the systems and methods disclosed herein can be similarly deployed and/or implemented in scenarios, situations, and settings far beyond the referenced scenarios. It can be readily appreciated that the system for performing a wet etching process can be effectively employed in practically any scenario in which a substrate is to be etched in a single wafer wet etching station to a desired surface uniformity and thickness.

It is to be understood that like numerals in the drawings represent like elements through the several figures, and that not all components and/or steps described and illustrated with reference to the figures are required for all embodiments or arrangements.

Thus, illustrative embodiments and arrangements of the present systems and methods provide a system, processes and computer implemented control methods, computer system, and computer program product for wet etching substrates. The flowchart and block diagrams in the figures illustrate the architecture, functionality, and operation of possible implementations of systems, methods and computer program products according to various embodiments and arrangements. In this regard, each block in the flowchart or block diagrams as it relates to a computer implemented method can represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the present invention, which is set forth in the following claims.

What is claimed is:

1. A method for wet-etching a wafer having a fan-out wafer level packaging (FOWLP) construction with one or more interconnect pads located within a redistribution layer (RDL) beneath a surface of wafer material to produce a processed wafer with each of the interconnect pads being exposed, the method comprising the steps of:
    measuring, at a measurement station, an initial thickness of the wafer;
    etching the surface of the wafer according to a first etch recipe and using a first etchant to thin the wafer material and leave a layer of residual wafer material having a prescribed residual substrate material thickness (RST) above the one or more interconnect pads, wherein the first etch recipe is based on the measured initial thickness of the wafer;
    etching the surface of the wafer according to a second etch recipe using a second etchant to thin the wafer material such that a respective portion of each of the interconnect pads is exposed; and
    wherein the first and second etchants comprise different chemical compositions;
    wherein the first etchant comprises an isotropic etchant and the second etchant comprises an anisotropic etchant.

2. The method of claim 1, further comprising the steps of:
    emitting light, with a light emitter, onto at least a portion of the surface of the wafer;
    detecting, with a light detector, the color of light being reflected by the portion of the wafer;
    generating light information based on the detected color of the reflected light;
    analyzing the light information to compare a light signature of the wafer being etched, to a reference light signature; and
    determine, based on the analysis of the light information, an end point when the interconnect pads are revealed by the etching with the second etchant.

3. The method of claim 1, wherein the first etchant has an etch rate that is at least two times faster than an etch rate of the second etchant.

4. The method of claim 1, further including at least one chip that is disposed along one surface of the redistribution layer and a mold compound is disposed and bonded to the redistribution layer and the at least one chip.

5. The method of claim 1, wherein the first etchant is of a type that is suitable to etch the wafer material and is of a type that can etch the one or more interconnect pads, wherein the second etchant is of a type that is suitable to etch the wafer material but not the one or more interconnect pads.

6. The method of claim 5, wherein the second etchant is an alkaline etchant that is configured to selectively etch the wafer material leaving the one or more interconnect pads at least substantially intact.

7. The method of claim 1, wherein the first etchant comprises a mixture of hydrofluoric acid (HF) and nitric acid ($HNO_3$).

8. The method of claim 7, wherein the first etchant is selected to smooth the surface of the wafer relative to a starting point during the first etching step and has a nitric acid content that is suitable to smooth the surface of the wafer.

9. The method of claim 1, wherein each of the steps of etching the surface of the wafer using the first etchant and the step of etching the surface of the wafer using the second etchant comprises etching the surface of the wafer at a plurality of radial locations.

10. The method of claim 9, wherein the surface of the wafer is etched with the first etchant to a first etch depth and the surface of the wafer is etched with the second etchant to a second etch depth which is less than the first etch depth.

11. The method of claim 10, wherein the step of etching the wafer with the first etchant is along the plurality of radial locations each of which are etched to respective prescribed RSTs along the entire respective radial locations, and wherein the first etch recipe includes adjustable parameters for controlling movement of a dispensing nozzle during the first etching step causing the nozzle to selectively dispense the first etchant onto each of the plurality of radial locations and thin each radial location a respective etch depth to leave the layer of residual wafer material having the respective prescribed RST, wherein the prescribed respective RSTs at each of the plurality of radial locations is generally uniform.

12. The method of claim 11, further comprising:
receiving, by a process controller including a memory and a processor configured by executing instructions in the form of code therein, a reference height for the one or more interconnect pads, the prescribed reveal height and the prescribed respective RSTs;
calculating, prior to the first etching step, initial respective RSTs for each of the plurality of radial locations on the surface of the wafer, wherein the initial respective RST of each particular radial location is calculated based on an initial thickness measured at the particular radial location, wherein the calculated initial respective RSTs of the plurality of radial locations are non-uniform; and
generating, with the process controller, the first-etch recipe based on the calculated initial respective RSTs and the prescribed respective RSTs.

13. The method of claim 12, wherein the first etch recipe includes adjustable parameters for controlling movement of the nozzle during the first etching step to selectively dispense the first etchant onto the respective radial locations and thin each respective radial location a respective first etch depth to produce the wafer having the layer of residual substrate material with the prescribed respective RST that is generally uniform.

14. The method of claim 13, wherein generating the first etch recipe comprises:
calculating, with the processor, the respective first etch depth for each of the plurality of radial locations, wherein the respective first etch depth for a particular radial location is calculated based on the initial respective RST for the particular radial location and the prescribed RST;
generating, with the configured processor, an etch recipe for the first etch step according to the respective first etch depths and an etch rate of the first etchant.

15. The method of claim 1, further comprising:
after the first etching step, measuring a post-etch thickness of the wafer; and
comparing the post-etch thickness to the prescribed RST.

16. The method of claim 15, further comprising:
if the post-etch thickness and the prescribed RST differ more than a prescribed amount, adjusting the second etch recipe based on the post-etch initial thickness.

17. The method of claim 15, further comprising:
if the post-etch thickness and the prescribed RST differ more than a prescribed amount,
adjusting the first etch recipe based on the comparison; and
repeating the step of etching the wafer with the first etchant.

18. The method of claim 1, wherein the second etchant is non-selective at least for silicon, copper, titanium, and any isolating materials used in the wafer.

19. The method of claim 18, wherein the isolating material comprises silicon nitride.

20. The method of claim 1, wherein the respective portion of each of the interconnect pads comprises a surface of the interconnect pad that faces the wafer material which comprises silicon.

21. The method of claim 1, wherein the prescribed residual substrate material thickness (RST) is between about 1 micron to about 2 microns.

22. A method for wet-etching a wafer having a fan-out wafer level packaging (FOWLP) construction with at least one metal interconnect pad located within a redistribution layer (RDL) beneath a surface of the wafer to produce a processed wafer with the at least one metal interconnect pad being at least partially exposed the method comprising the steps of:
measuring, at a measurement station, an initial thickness of the wafer at each of a plurality of radial locations along the wafer;
calculating, by a process controller, a respective first etch depth for each of the plurality of radial locations, wherein the respective first etch depth for a particular radial location is the amount of material to be removed at the particular radial location during the first etching step and is a function of the measured initial thickness of the particular radial location and a prescribed respective residual substrate material thickness (RST) which is a thickness of a layer of residual wafer material left over the at least one interconnect pad after the first etching step, and wherein the respective first etch depths are non-uniform;
generating, with the process controller, a first-etch recipe based on the calculated respective first etch depths, wherein the first etch recipe controls movement of a nozzle during the first etching step causing the nozzle to selectively dispense a first etchant onto each of the plurality radial locations thereby thinning the wafer at each radial location the respective first etch depths, wherein the first etch depths are depths that do not reveal the at least one interconnect pad;
etching, at a first etching station, the surface of the wafer according to the first etch recipe and using the first etchant;
etching, at a second etching station, the surface of the wafer according to a second etch recipe using a second etchant to thin the wafer material such that a respective portion of the at least one interconnect pad is exposed; and
wherein the first etching step is an isotropic wet-etching step, the second etching step is an anisotropic wet-etching step, and the first and second etchants comprise different chemical compositions.

23. The method of claim 22, wherein each radial location is an annular area on the surface of the wafer that surrounds the center at a given radial distance or range of radial distances from the center and etch depth along one given radial location is at least substantially uniform.

24. The method of claim 22, wherein the first etchant comprises a mixture of $HF:HNO_3$ and further includes $H_3PO_4$ and $H_2SO_4$.

25. The method of claim 22, wherein the second etchant has high selectivity for silicon-based compounds and low selectivity to copper (Cu) of which the least one metal interconnect pad is fabricated from.

26. The method of claim 22, wherein the first etchant is of the type that is suitable to etch the wafer material and can etch conductive material of the at least one metal interconnect pad.

27. The method of claim 22, wherein the second etchant is an alkaline etchant that is selected to selectively etch the wafer material leaving the at least one metal interconnect pad at least substantially intact.

28. The method of claim 22, wherein the step of etching at the second etching station comprises removing the layer of residual substrate material above the at least one metal interconnect pad and selectively removing the wafer material around the at least one metal interconnect pad to reveal the respective portions of the at least one metal interconnect pad.

29. The method of claim 22, further comprising:
determining, with the processor, an initial RST of each of the plurality of radial locations on the surface of the wafer, wherein the initial RST of a particular radial location is calculated based on the initial thickness measured at the particular radial location, and wherein the calculated initial RSTs are non-uniform; and
wherein the respective first-etch depth for a particular radial location is calculated based on the calculated initial RSTs for the particular radial location and the prescribed RST.

30. The method of claim 29, further comprising:
if the post-etch thickness and the prescribed RST differ more than a prescribed degree,
adjusting the first etch recipe based on the comparison; and
repeating the step of etching the wafer at the first etching station.

31. The method of claim 22, wherein the prescribed residual substrate material thickness (RST) is between about 1 micron to about 2 microns.

* * * * *